US012740219B2

(12) United States Patent
Leem et al.

(10) Patent No.: US 12,740,219 B2
(45) Date of Patent: Sep. 15, 2026

(54) INFRARED PHOTODIODE AND SENSOR AND ELECTRONIC DEVICE

(71) Applicant: Samsung Electronics Co., Ltd., Suwon-si (KR)

(72) Inventors: Dong-Seok Leem, Suwon-si (KR); Insun Park, Suwon-si (KR); Rae Sung Kim, Suwon-si (KR); Sangdong Kim, Suwon-si (KR); Sang Ho Park, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 393 days.

(21) Appl. No.: 18/423,560

(22) Filed: Jan. 26, 2024

(65) Prior Publication Data

US 2024/0276743 A1 Aug. 15, 2024

(30) Foreign Application Priority Data

Jan. 27, 2023 (KR) ........................ 10-2023-0011148

(51) Int. Cl.

| | |
|---|---|
| ***H10K 30/85*** | (2023.01) |
| ***H10K 30/30*** | (2023.01) |
| ***H10K 39/32*** | (2026.01) |
| ***H10K 85/20*** | (2023.01) |
| ***H10K 85/30*** | (2023.01) |

(Continued)

(52) U.S. Cl.

CPC ............. *H10K 30/85* (2023.02); *H10K 30/30* (2023.02); *H10K 30/353* (2023.02); *H10K 39/32* (2023.02); *H10K 85/211* (2023.02); *H10K 85/30* (2023.02); *H10K 85/622* (2023.02); *H10K 85/6572* (2023.02); *H10K 2101/30* (2023.02)

(58) Field of Classification Search

CPC . H10K 30/00–451; H10K 30/85; H10K 39/32
See application file for complete search history.

(56) References Cited

U.S. PATENT DOCUMENTS

| | | | |
|---|---|---|---|
| 8,288,939 | B2 | 10/2012 | Hayashi |
| 9,214,502 | B2 | 12/2015 | So et al. |

(Continued)

FOREIGN PATENT DOCUMENTS

| | | |
|---|---|---|
| KR | 2021-0109158 A | 9/2021 |

OTHER PUBLICATIONS

Li, Ning, et al. "Tuning the charge blocking layer to enhance photomultiplication in organic shortwave infrared photodetectors." J. Mater. Chem. C, 2020, 8, 15142-15149.

*Primary Examiner* — Daniel P Shook
(74) *Attorney, Agent, or Firm* — Harness, Dickey & Pierce, P.L.C.

(57) ABSTRACT

An infrared photodiode includes an anode, a cathode, a photoelectric conversion layer between the anode and the cathode and including an infrared absorbing material, and a first auxiliary layer between the anode and the photoelectric conversion layer and a second auxiliary layer between the cathode and the photoelectric conversion layer. The first auxiliary layer and the second auxiliary layer each independently include an electron transport material that is configured to facilitate electron introduction, and/or facility electron transport, and/or inhibit hole movement. A sensor may include the infrared photodiode. An electronic device may include the infrared photodiode.

20 Claims, 9 Drawing Sheets

(51) Int. Cl.
*H10K 85/60* (2023.01)
*H10K 101/30* (2023.01)

(56) References Cited

U.S. PATENT DOCUMENTS

| | | | | |
|---|---|---|---|---|
| 9,472,707 | B2 | 10/2016 | Shirane et al. | |
| 11,227,959 | B2 | 1/2022 | Siegmund et al. | |
| 11,329,241 | B2 | 5/2022 | Forrest et al. | |
| 11,631,819 | B2 | 4/2023 | Park et al. | |
| 2010/0207112 | A1 | 8/2010 | Furst et al. | |
| 2012/0001164 | A1 | 1/2012 | Gao et al. | |
| 2021/0313516 | A1 | 10/2021 | Okabe | |
| 2021/0340312 | A1 | 11/2021 | Lee et al. | |
| 2021/0380607 | A1* | 12/2021 | Kwon | C07D 519/00 |

* cited by examiner

INFRARED PHOTODIODE AND SENSOR AND ELECTRONIC DEVICE

CROSS-REFERENCE TO RELATED APPLICATION

This application claims priority to and the benefit of Korean Patent Application No. 10-2023-0011148 filed in the Korean Intellectual Property Office on Jan. 27, 2023, the entire contents of which are incorporated herein by reference.

BACKGROUND

1. Field

Infrared photodiodes, sensors, and electronic devices are disclosed.

2. Description of the Related Art

In recent years, infrared sensors configured to detect light in infrared wavelength spectrum have been researched to improve sensitivity of the sensors in a low-illumination environment or for use as a biometric or authentication device. Silicon photodiodes may be used as infrared sensors. However, although silicon is configured to absorb light in a near-infrared wavelength spectrum of less than about 1000 nm from a visible wavelength spectrum, there is a limit in absorbing light in the near-infrared wavelength spectrum of greater than or equal to about 1000 nm.

SUMMARY

Some example embodiments provide an infrared photodiode that may be effectively used to sense light in a near-infrared to short-wavelength infrared spectrum of greater than or equal to about 1000 nm.

Some example embodiments provide a sensor including the infrared photodiode.

Some example embodiments provide an electronic device including the infrared photodiode or the sensor.

According to some example embodiments, an infrared photodiode may include an anode, a cathode, a photoelectric conversion layer between the anode and the cathode and including an infrared absorbing material, and a first auxiliary layer between the anode and the photoelectric conversion layer and a second auxiliary layer between the cathode and the photoelectric conversion layer, wherein the first auxiliary layer and the second auxiliary layer may each independently include an electron transport material that may facilitate introduction of electrons, and/or transport of electrons, and/or inhibit hole movement.

A thickness of the first auxiliary layer may be greater than about 3 nanometers (nm) and less than about 50 nm.

A thickness of the second auxiliary layer may be greater than or equal to about 1 nm and less than or equal to about 50 nm.

The electron transport material included in the first auxiliary layer may have a same bandgap energy or a smaller bandgap energy in relation to the electron transport material comprised in the second auxiliary layer.

A bandgap energy of the electron transport material included in the first auxiliary layer may be in a range of from about 2.5 electron volts (eV) to about 3.5 eV, and a bandgap energy of the electron transport material included in the second auxiliary layer may be in a range of from about 3.0 electron volts (eV) to about 3.5 eV.

HOMO (Highest Occupied Molecular Orbital) energy of the electron transport material included in the first auxiliary layer may be in a range of from about 5.5 eV to about 7.5 eV.

LUMO (Lowest Unoccupied Molecular Orbital) energy of the electron transport material included in the second auxiliary layer may be in a range of from about 2.5 eV to about 4.5 eV.

The electron transport material may include one or more of the compounds represented by Chemical Formulae 1 to 5 and fullerene:

Chemical Formula 1

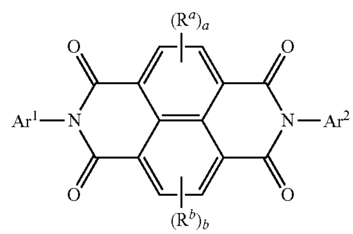

In Chemical Formula 1, $Ar^1$ and $Ar^2$ may each independently be a substituted or unsubstituted C10 to C30 aryl group or a substituted or unsubstituted C2 to C30 heteroaryl group, $R^a$ and $R^b$ may each independently be hydrogen, deuterium, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C20 aryl group, a substituted or unsubstituted C6 to C20 aryloxy group, a substituted or unsubstituted C3 to C20 heteroaryl group, a substituted or unsubstituted C3 to C20 cycloalkyl group, a substituted or unsubstituted C3 to C20 heterocycloalkyl group, or any combination thereof, and a and b are each independently integers of 1 or 2, Chemical Formula 2

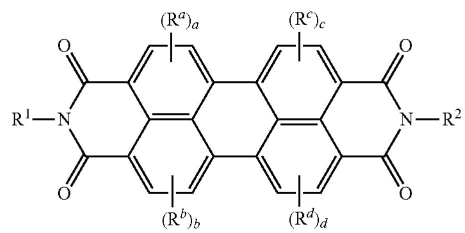

wherein, in Chemical Formula 2, $R^1$ and $R^2$ may each independently be hydrogen, deuterium, a substituted or unsubstituted C6 to C30 aryl group, or a substituted or unsubstituted C3 to C30 heteroaryl group, $R^a$ to $R^d$ may each independently be hydrogen, deuterium, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C20 aryl group, a substituted or unsubstituted C6 to C20 aryloxy group, a substituted or unsubstituted C3 to C20 heteroaryl group, a substituted or unsubstituted C3 to C20 cycloalkyl group, a substituted or unsubstituted C3 to C20 heterocycloalkyl group, or any combination thereof, and a to d are each independently an integer of 1 or 2, Chemical Formula 3

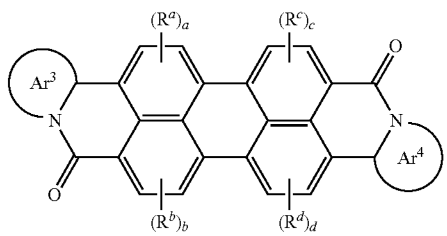

Chemical Formula 4

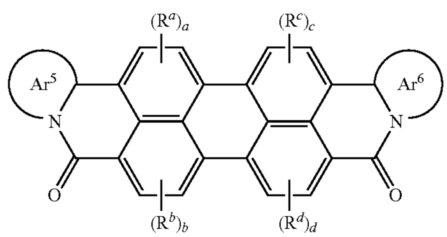

wherein, in Chemical Formulas 3 and 4, $Ar^3$ to $Ar^6$ may each independently be hydrogen, a substituted or unsubstituted C6 to C30 arene group, or a substituted or unsubstituted C3 to C30 heteroarene group, $R^a$ to $R^d$ may each independently be hydrogen, deuterium, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C20 aryl group, a substituted or unsubstituted C6 to C20 aryloxy group, a substituted or unsubstituted C3 to C20 heteroaryl group, a substituted or unsubstituted C3 to C20 cycloalkyl group, a substituted or unsubstituted C3 to C20 heterocycloalkyl group, or any combination thereof, and a to d may each independently be an integer of 1 or 2, Chemical Formula 5

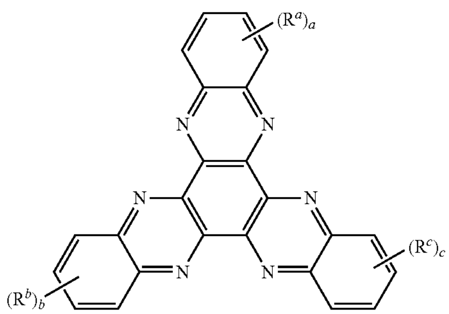

wherein, in Chemical Formula 5, $R^a$ to $R^c$ may each independently be hydrogen, deuterium, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C20 aryl group, a substituted or unsubstituted C6 to C20 aryloxy group, a substituted or unsubstituted C3 to C20 heteroaryl group, a substituted or unsubstituted C3 to C20 cycloalkyl group, a substituted or unsubstituted C3 to C20 heterocycloalkyl group, or any combination thereof, and a to c may each independently be an integer of 1 to 4.

The first auxiliary layer and the second auxiliary layer may each independently include one or more compound represented by Chemical Formula 1 or a compound represented by Chemical Formula 5.

The photoelectric conversion layer may include the infrared absorbing material and a counter material forming a pn junction with the infrared absorbing material.

A peak wavelength of an EQE spectrum of the infrared photodiode may be in a range of about 1000 nm to about 3000 nm, and a peak wavelength of the absorption spectrum of the photoelectric conversion layer may be greater than about 700 nm and less than about 1500 nm.

The infrared absorbing material may include metal phthalocyanine complex, metal naphthalocyanine complex, a coplanar compound having at least one quinoid moiety, or any combination thereof.

The infrared absorbing material may be a coplanar compound including at least one quinoid moiety.

The coplanar compound including the at least one quinoid moiety may be represented by Chemical Formula 6:

Chemical Formula 6

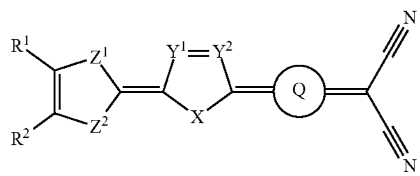

wherein, in Chemical Formula 6,

X is O, S, Se, Te, SO, $SO_2$, $NR^a$, $CR^bR^c$, or $SiR^dR^e$;

$Y^1$ and $Y^2$ are each independently $CR^f$ or N;

$Z^1$ and $Z^2$ are each independently O, S, Se, Te, or $NR^g$;

Q is at least one substituted or unsubstituted 5-membered quinoid ring, at least one substituted or unsubstituted 6-membered quinoid ring, or a fused ring thereof;

$R^1$ and $R^2$ are each independently hydrogen, a substituted or unsubstituted C1 to C30 alkyl group, a substituted or unsubstituted C1 to C30 alkoxy group, a substituted or unsubstituted C1 to C30 thioalkoxy group, a substituted or unsubstituted C6 to C30 aryl group, a substituted or unsubstituted C3 to C30 heterocyclic group, a substituted or unsubstituted silyl group, a halogen, or any combination thereof;

$R^a$ to $R^g$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, a cyano group, or any combination thereof;

$R^1$ and $R^2$ are each independently present or combine with each other to form a ring;

$R^b$ and $R^c$ are each independently present or combine with each other to form a ring;

$R^d$ and $R^e$ are each independently present or combine with each other to form a ring; and adjacent $R^f$'s are each independently present or combine with each other to form a ring.

The anode may include a reflective layer, and the cathode may include a semi-transparent layer.

The cathode may include an inorganic nanolayer that faces the photoelectric conversion layer, and the inorganic nanolayer may include ytterbium (Yb), calcium (Ca), potassium (K), barium (Ba), magnesium (Mg), lithium fluoride (LiF), or any alloy thereof.

The anode may include a light-transmitting auxiliary layer disposed between the reflective layer and the photoelectric conversion layer.

A thickness of the light-transmitting auxiliary layer may be in a range of about 5 nm to about 50 nm.

The infrared photodiode may be configured to exhibit light amplification in response to a driving voltage applied to the infrared photodiodes being equal to or greater than a specific driving voltage magnitude.

According to some example embodiments, a sensor may include a semiconductor substrate; and the infrared photodiode on the semiconductor substrate.

According to some example embodiments, an electronic device may include the infrared photodiode.

Light in the near-infrared to short-wavelength infrared spectrum of greater than or equal to about 1000 nm may be effectively and photoelectrically converted by using the infrared photodiode according to some example embodiments.

DETAILED DESCRIPTION

Figure 1:
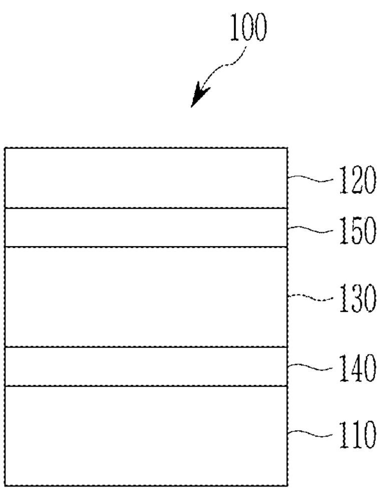
FIG. 1 is a cross-sectional view showing an example of an infrared photodiode according to some example embodiments.

Hereinafter, some example embodiments will be described in detail so that those of ordinary skill in the art can easily implement them. The inventive concepts may, however, be embodied in many different forms and are not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

In the drawings, parts having no relationship with the description are omitted for clarity of some example embodiments, and the same or similar constituent elements are indicated by the same reference numeral throughout the specification.

Hereinafter, the terms "lower" and "upper" are used for better understanding and ease of description, but do not limit the location relationship.

As used herein, when a definition is not otherwise provided, "substituted" refers to replacement of hydrogen of a compound by a substituent selected from a halogen, a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C30 alkyl group, a C2 to C30 alkenyl group, a C2 to C30 alkynyl group, a C6 to C30 aryl group, a C7 to C30 arylalkyl group, a C1 to C30 alkoxy group, a C1 to C20 heteroalkyl group, a C3 to C20 heterocyclic group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and any combination thereof.

As used herein, when a definition is not otherwise provided, "hetero" refers to one including 1 to 4 heteroatoms selected from N, O, S, Se, Te, Si, and P.

Hereinafter, when a definition is not otherwise provided, a work function or an energy level, such as, for example, HOMO energy level, or LUMO energy level, etc., is expressed as an absolute value from a vacuum level. In addition, when the work function or the energy level is referred to be deep, high, or large, it may have a large absolute value based on "0 eV" of the vacuum level while when the work function or the energy level is referred to be shallow, low, or small, it may have a small absolute value based on "0 eV" of the vacuum level. Further, the differences between the work function and/or the energy level may be values obtained by subtracting a small value of the absolute value from a large value of the absolute value.

Hereinafter, when a definition is not otherwise provided, the HOMO energy level may be evaluated with an amount of photoelectrons emitted by energy when irradiating UV light to a thin film using AC-2 (Hitachi) or AC-3 (Riken Keiki Co., Ltd.).

Hereinafter, when a definition is not otherwise provided, "bandgap energy" refers to an absolute value of a difference between HOMO energy level and LUMO energy level. In addition, when a bandgap energy is broad or large, it means an absolute value of a difference between HOMO energy level and LUMO energy level is large.

Hereinafter, the wavelength at which the light absorption is maximum in the optical absorption spectrum is referred to as "maximum absorption wavelength," and the wavelength at which the external quantum efficiency (EQE) is maximum in the external quantum efficiency spectrum (EQE spectrum) is referred to as "maximum external quantum efficiency wavelength" or "maximum EQE wavelength."

Hereinafter, "peak wavelength" may be a wavelength corresponding to a peak of each wavelength spectrum in one or more wavelength spectra. When there are two or more wavelength spectra in the entire wavelength region, the "peak wavelength" may be two or more.

Hereinafter, an infrared photodiode according to some example embodiments is described.

The infrared photodiode according to some example embodiments may be configured to absorb at least a portion of light in an infrared wavelength region (e.g., infrared wavelength spectrum) and convert it (e.g., the absorbed portion of light) photoelectrically, wherein the infrared wavelength region may include a portion or all of the near-infrared, short-wavelength infrared, mid-wavelength infrared, and far-infrared wavelength regions, for example greater than about 700 nm and less than or equal to about 1 mm, within the above range, greater than about 700 nm and less than or equal to about 3000 nm, greater than about 700 nm and less than or equal to about 2500 nm, greater than about 700 nm and less than or equal to about 2000 nm, greater than about 700 nm and less than or equal to about 1800 nm, greater than about 700 nm and less than or equal to about 1500 nm, from about 750 nm to about 1 mm, from about 750 nm to about 3000 nm, from about 750 nm to about 2500 nm, from about 750 nm to about 2000 nm, from about 750 nm to about 1800 nm, from about 750 nm to about 1500 nm, from about 800 nm to about 1 mm, from about 800 nm to about 3000 nm, from about 800 nm to about 2500 nm, from about 800 nm to about 2000 nm, from about 800 nm to about 1800 nm, or from about 800 nm to about 1500 nm, but the present inventive concepts are not limited thereto.

FIG. 1 is a cross-sectional view showing an example of an infrared photodiode according to some example embodiments.

Referring to FIG. 1, an infrared photodiode 100 according to some example embodiments includes an anode 110, which is a lower electrode, a cathode 120, which is an upper electrode, a photoelectric conversion layer 130 disposed between the anode 110 and the cathode 120, a first auxiliary layer 140 disposed between anode 110 and photoelectric conversion layer 130, and a second auxiliary layer 150 disposed between cathode 120 and photoelectric conversion layer 130.

A substrate, which is not shown in FIG. 1, may be disposed under anode 110. The substrate may include an inorganic material, such as, for example, glass, or an organic material, such as, for example, polycarbonate, polymethyl methacrylate, polyethylene terephthalate, polyethylene naphthalate, polyamide, polyether sulfone, or combinations thereof, or may be a silicon wafer. The substrate may be omitted.

Anode 110 may be a reflective electrode that has a reflective layer.

The reflective layer may have high reflectance and low light transmittance, and may have, for example, a reflectance of from about 10% to about 100%, from about 20% to about 100%, from about 30% to about 100%, from about 50% to about 100%, from about 70% to about 100%, from about 80% to about 100%, from about 90% to about 100%, from about 95% to about 100%, from about 98% to about 100%, or from about 99% to about 100%, for example a light transmittance of greater than or equal to about 0% to less than about 10%, from about 0% to about 8%, from about 0% to about 7%, from about 0% to about 5%, from about 0% to about 3%, or from about 0% to about 1%. The reflective layer may include an optically opaque material, for example, a metal, a metal nitride, or any combination thereof, for example, silver (Ag), copper (Cu), aluminum (Al), gold (Au), titanium (Ti), chromium (Cr), nickel (Ni), alloys thereof, nitrides thereof (e.g., TiN), or any combination thereof, but is not limited thereto. The reflective layer may have one or two or more layers. The anode 110 may include the reflective layer and a light-transmitting auxiliary layer between (e.g., directly between) the reflective layer and the photoelectric conversion layer 130. The light-transmitting auxiliary layer may include a light-transmitting material, for example indium tin oxide (ITO). The light-transmitting auxiliary layer may have a thickness that is in a range of from about 5 nm to about 50 nm.

Cathode 120 may be a semi-transmissive electrode and may be an incident electrode located in the direction in which light enters, such that the cathode 120 is proximate to the light incident side of the infrared photodiode 100 in relation to the anode 110.

The semi-transmissive electrode, which may include a semi-transparent layer, may have a light transmittance of from about 10% to about 70%, for example, from about 20% to about 60%, or from about 30% to about 50%, and may selectively transmit light in a region of certain wavelengths and may reflect or absorb light in the other regions of wavelengths. The semi-transmissive electrode may include, for example, a thin metal or layer having a thickness of about 1 nm to about 50 nm, and at least one of silver (Ag), copper (Cu), aluminum (Al), magnesium (Mg), ytterbium (Yb), magnesium-silver (Mg—Ag), magnesium-aluminum (Mg—Al), or any combination thereof, and is not limited thereto. Cathode 120 may comprise an inorganic nanolayer that faces the photoelectric conversion layer 130. The inorganic nanolayer may include ytterbium (Yb), calcium (Ca), potassium (K), barium (Ba), magnesium (Mg), lithium fluoride (LiF), or any alloy thereof.

Photoelectric conversion layer 130 may be configured to absorb light (e.g., incident light) of at least a portion of the infrared wavelength region and convert it (e.g., the absorbed light) into an electrical signal. The absorption spectrum of photoelectric conversion layer 130 may have, for example, a maximum absorption wavelength ($\lambda_{max, A}$), also referred to as a peak wavelength of the absorption spectrum, in a wavelength range of greater than about 700 nm and less than or equal to about 3000 nm, for example, from about 750 nm to about 3000 nm, from about 750 nm to about 2500 nm, from about 750 nm to about 2300 nm, from about 750 nm to about 2000 nm, from about 750 nm to about 1800 nm, from about 750 nm to about 1500 nm, from about 750 nm to about 1300 nm, from about 750 nm to about 1200 nm, from about 750 nm to about 1100 nm, or from about 750 nm to about 1000 nm. Accordingly, it will be understood that photoelectric conversion layer 130 may include an infrared absorbing material configured to absorb light (e.g., incident light) of at least a portion of the infrared wavelength region. The infrared absorbing material may be configured to photoelectrically convert the absorbed light into an electrical signal.

The EQE spectrum of photoelectric conversion layer 130 may have, for example, a maximum EQE wavelength (e.g., peak wavelength of the EQE spectrum of the photoelectric conversion layer 130) in a wavelength range of greater than about 700 nm and less than or equal to about 3000 nm, for example, from about 750 nm to about 3000 nm, from about 750 nm to about 2500 nm, from about 750 nm to about 2300 nm, from about 750 nm to about 2000 nm, from about 750 nm to about 1800 nm, from about 750 nm to about 1500 nm, from about 750 nm to about 1300 nm, from about 750 nm to about 1200 nm, from about 750 nm to about 1100 nm, or from about 750 nm to about 1000 nm. The EQE spectrum of infrared photodiode 100 may have, for example, a maximum EQE wavelength (e.g., peak wavelength of the EQE spectrum of the infrared photodiode 100) in a wavelength range of greater than about 700 nm and less than or equal to about 3000 nm, for example, from about 750 nm to about 3000 nm, from about 750 nm to about 2500 nm, from about 750 nm to about 2300 nm, from about 750 nm to about 2000 nm, from about 750 nm to about 1800 nm, from about 750 nm to about 1500 nm, from about 750 nm to about 1300 nm, from about 750 nm to about 1200 nm, from about 750 nm to about 1100 nm, or from about 750 nm to about 1000 nm. The peak wavelength of the EQE spectrum of the photoelectric conversion layer 130 may be the same as or different from the peak wavelength of the EQE spectrum of the infrared photodiode 100.

Photoelectric conversion layer 130 may include at least one of a first material and at least one of a second material that may be able to make a pn junction together. Accordingly, the infrared absorbing material of the photoelectric conversion layer 130 may include at least one of the first material or the second material. For example, at least one of the first material or the second material may include the infrared absorbing material of the photoelectric conversion layer 130. In some example embodiments, the first material may include the infrared absorbing material, and the second material may include a counter material forming a pn junction with the infrared absorbing material.

The first material and the second material may each be an organic material, an inorganic material, or an organic/inorganic material. For example, at least one of the first material or the second material may be an organic material. For example, the first material and the second material may each be a non-polymeric material and be a vapor deposition compound. At least one of the first material or the second material may be a light absorbing material. For example, the first material and the second material may each be a light absorbing material.

The first material and the second material may have different absorption characteristics, for example, the absorption spectrum of the first material and the absorption spectrum of the second material may be different, for example, the maximum absorption wavelength of the absorption spectrum of the first material and the absorption spectrum of the second material may be different. For example, the absorption spectrum of the first material may be located in a longer wavelength region than the absorption spectrum of the second material, and the maximum absorption wavelength of the absorption spectrum of the first material may be longer than the maximum absorption wavelength of the absorption spectrum of the second material.

For example, the first material may be an infrared absorbing material that mainly absorbs light in the infrared wavelength region, and the maximum absorption wavelength of the absorption spectrum of the first material may be in the infrared wavelength region. The maximum absorption wavelength of the absorption spectrum of the first material may be, for example, greater than about 700 nm and less than or equal to 3000 nm, and may, for example, be in a region of greater than about 700 nm and less than or equal to about 3000 nm, for example, from about 750 nm to about 2500 nm, from about 750 nm to about 2300 nm, from about 750 nm to about 2000 nm, from about 750 nm to about 1800 nm, from about 750 nm to about 1500 nm, from about 750 nm to about 1300 nm, from about 750 nm to about 1200 nm, from about 750 nm to about 1100 nm, from about 750 nm to about 1000 nm, from about 800 nm to about 3000 nm, from about 800 nm to about 2500 nm, from about 800 nm to about 2300 nm, from about 800 nm to about 2000 nm, from about 800 nm to about 1800 nm, from about 800 nm to about 1500 nm, from about 800 nm to about 1300 nm, from about 800 nm to about 1200 nm, from about 800 nm to about 1100 nm, from about 800 nm to about 1000 nm, from about 850 nm to about 3000 nm, from about 850 nm to about 2500 nm, from about 850 nm to about 2300 nm, from about 850 nm to about 2000 nm, from about 850 nm to about 1800 nm, from about 850 nm to about 1500 nm, from about 850 nm to about 1300 nm, from about 850 nm to about 1200 nm, from about 850 nm to about 1100 nm, or from about 850 nm to about 1000 nm.

For example, the second material may not be an infrared absorbing material that mainly absorbs light in the infrared wavelength region. For example, the maximum absorption wavelength of the absorption spectrum of the second material may not fall in the infrared wavelength region. For example, the second material may be a visible light absorbing material that mainly absorbs light in the visible light wavelength region, and the maximum absorption wavelength of the absorption spectrum of the second material may be in the visible light wavelength region. The visible light wavelength region may be, for example, about 380 nm or more and less than 700 nm, and within the above range, for example, it may be from about 380 nm to about 680 nm.

The first material and the second material may have different electrical characteristics. For example, the energy diagram of the first material and the energy diagram of the second material may be different.

For example, the first material may have a relatively shallow HOMO energy level. For example, the first material may have a HOMO energy level of about 4.0 eV to about 5.5 eV. The HOMO energy level of the second material may be deeper than the HOMO energy level of the first material. For example, a difference between the HOMO energy level of the second material and the HOMO energy level of the first material may be greater than or equal to about 0.5 eV, and within the above range, may be greater than or equal to about 0.7 eV, greater than or equal to about 0.8 eV, greater than or equal to about 0.9 eV, or greater than or equal to about 1.0 eV, for example, from about 0.5 eV to about 2.0 eV, from about 0.5 eV to about 1.8 eV, from about 0.5 eV to about 1.7 eV, from about 0.5 eV to about 1.5 eV, from about 0.7 eV to about 2.0 eV, from about 0.7 eV to about 1.8 eV, from about 0.7 eV to about 1.7 eV, from about 0.7 eV to about 1.5 eV, from about 0.8 eV to about 2.0 eV, from about 0.8 eV to about 1.8 eV, from about 0.8 eV to about 1.7 eV, from about 0.8 eV to about 1.5 eV, from about 0.9 eV to about 2.0 eV, from about 0.9 eV to about 1.8 eV, from about 0.9 eV to about 1.7 eV, from about 0.9 eV to about 1.5 eV, from about 1.0 eV to about 2.0 eV, from about 1.0 eV to about 1.8 eV, from about 1.0 eV to about 1.7 eV, or from about 1.0 eV to about 1.5 eV. For example, the HOMO energy level of the second material may be from about 5.6 eV to about 7.0 eV.

For example, the LUMO energy level of the first material may be from about 3.4 eV to about 4.5 eV. The LUMO energy level of the second material may be deeper or shallower than the LUMO energy level of the first material, and the LUMO energy level of the second material may be from about 3.6 eV to about 5.0 eV.

For example, the energy bandgap of the first material may be relatively narrow. For example, the energy bandgap of the first material may be less than or equal to about 1.8 eV, less than or equal to about 1.7 eV, less than or equal to about 1.6 eV, less than or equal to about 1.5 eV, less than or equal to about 1.4 eV, less than or equal to about 1.3 eV, or less than or equal to about 1.2 eV, and within the above range, may be from about 0.5 eV to about 1.8 eV, from about 0.5 eV to about 1.7 eV, from about 0.5 eV to about 1.6 eV, from about 0.5 eV to about 1.5 eV, from about 0.5 eV to about 1.4 eV, from about 0.5 eV to about 1.3 eV, or from about 0.5 eV to about 1.2 eV.

For example, the bandgap energy of the second material may be wider than the bandgap energy of the first material. For example, the bandgap energy of the second material may be wider than the bandgap energy of the first material by greater than or equal to about 0.3 eV, within the range, greater than or equal to about 0.5 eV, greater than or equal to about 0.7 eV, greater than or equal to about 0.8 eV, or greater than or equal to about 1.0 eV. For example, the bandgap energy of the second material may be wider than the bandgap energy of the first material by from about 0.3 eV to about 2.0 eV, from about 0.5 eV to about 2.0 eV, from about 0.7 eV to about 2.0 eV, from about 0.8 eV to about 2.0 eV, or from about 1.0 eV to about 2.0 eV. For example, the bandgap energy of the second material may be wider than the bandgap energy of the first material by from about 0.8 eV to about 2.4 eV.

For example, the first material may be selected from materials that satisfy the optical and electrical properties described above, such as, for example, a metal phthalocyanine complex, a metal naphthalocyanine complex, a coplanar compound having (e.g., comprising) at least one quinoid moiety, or any combination thereof.

The metal of the metal phthalocyanine complex or metal naphthalocyanine complex may be copper (Cu), tin (Sn), cobalt (Co), iron (Fe), nickel (Ni), zinc (Zn), magnesium (Mg), or any combination thereof, and is not limited thereto.

For example, the coplanar compound having at least one quinoid moiety may be represented by Chemical Formula 6, but is not limited thereto.

Chemical Formula 6

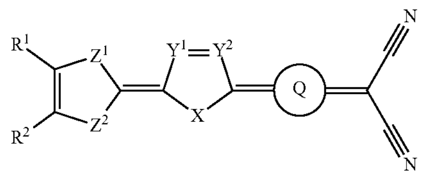

In Chemical Formula 6,

X is O, S, Se, Te, SO, $SO_2$, $NR^a$, $CR^bR^c$, or $SiR^dR^e$, $Y^1$ and $Y^2$ are each independently $CR^f$ or N, $Z^1$ and $Z^2$ are each independently O, S, Se, Te, or $NR^g$, Q is at least one substituted or unsubstituted 5-membered quinoid ring, at least one substituted or unsubstituted 6-membered quinoid ring, or a fused ring thereof, $R^1$ and $R^2$ are each independently hydrogen, a substituted or unsubstituted C1 to C30 alkyl group, a substituted or unsubstituted C1 to C30 alkoxy group, a substituted or unsubstituted C1 to C30 thioalkoxy group, a substituted or unsubstituted C6 to C30 aryl group, a substituted or unsubstituted C3 to C30 heterocyclic group, a substituted or unsubstituted silyl group, a halogen, or any combination thereof, $R^a$ to $R^g$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, a cyano group, or any combination thereof, $R^1$ and $R^2$ are each independently present or combine with each other to form a ring, $R^b$ and $R^c$ are each independently present or combine with each other to form a ring, $R^d$ and $R^e$ are each independently present or combine with each other to form a ring, and adjacent $R^f$'s are each independently present or combine with each other to form a ring.

For example, X may be O, S, Se, Te, or $NR^a$, for example O, S, Se or Te, for example S, Se, or Te, for example S or Se, for example S.

For example, $Y^1$ and $Y^2$ may each be $CR^f$, for example, each may be CH.

For example, one of $Z^1$ or $Z^2$ may be S and the other of $Z^1$ or $Z^2$ may be S, Se, or Te. For example, one of $Z^1$ or $Z^2$ may be S and the other of $Z^1$ or $Z^2$ may be S or Se. For example, $Z^1$ and $Z^2$ may each be S.

For example, X, $Z^1$, and $Z^2$ may each independently be S or Se, for example, each may be S.

For example, Q may include at least one substituted or unsubstituted 5-membered quinoid ring, at least one substituted or unsubstituted 6-membered quinoid ring, or a fused ring thereof. For example, Q may be one or two substituted or unsubstituted 5-membered quinoid rings; a fused ring of one or two substituted or unsubstituted 5-membered quinoid rings; one or two substituted or unsubstituted 6-membered quinoid rings; a fused ring of one or two substituted or unsubstituted 6-membered quinoid rings; a fused ring of one or two substituted or unsubstituted 5-membered quinoid rings and one or two substituted or unsubstituted 6-membered quinoid rings; or any combination thereof.

For example, Q may be one selected from the groups of Group X, but is not limited thereto.

Group X

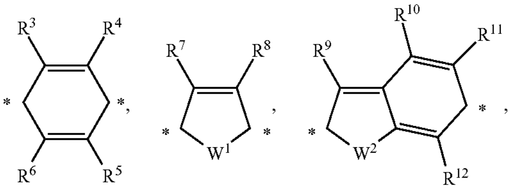

-continued

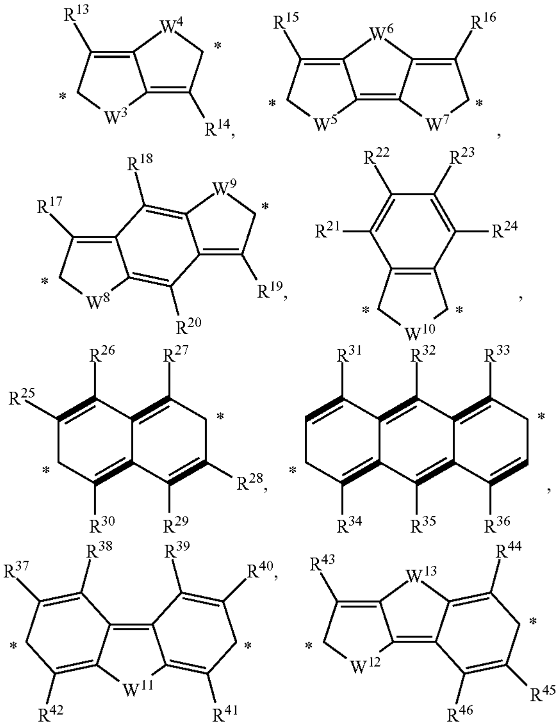

In Group X, $W^1$ to $W^{13}$ may each independently be S, Se, or Te, $R^3$ to $R^{46}$ may each independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, a cyano group, or any combination thereof, $R^3$ to $R^{46}$ may each independently be present or adjacent two of $R^3$ to $R^{46}$ may be bonded to each other to form a ring, and

* may be a linking point with Chemical Formula 1.

For example, the material represented by Chemical Formula 6 may be represented by Chemical Formula 6-1, but is not limited thereto.

Chemical Formula 6-1

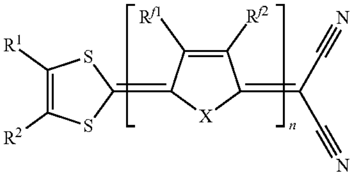

In Chemical Formula 6-1,

X, $R^1$, and $R^2$ are the same as described above (e.g., the same as X, $R^1$, and $R^2$ of Chemical Formula 1), $R^{f1}$ and $R^{f2}$ may each independently be hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, a cyano group, or any combination thereof, and n may be an integer of 2 to 4 (e.g., n may be an integer that is between 2 and 4, inclusively, and thus may be an integer that is one of 2, 3, or 4).

In some example embodiments, the infrared absorbing material according to any of the example embodiments may be provided independently of the photoelectric conversion layer 130 and/or any other elements of the infrared photodiode 100. For example, the infrared absorbing material according to some example embodiments may be provided as a liquid material, as a liquid solution (e.g., in a solution state), as a solid material, or the like, which may be used as a process input to at least partially form (e.g., manufacture) a photoelectric conversion layer 130 that is included in an infrared photodiode 100.

For example, the second material may be selected from materials that satisfy the optical and electrical properties described above, and may include, for example, fullerene or a fullerene derivative.

The first material and the second material may be mixed in the form of a bulk heterojunction.

The first material and the second material may be included in a particular (or, alternatively, predetermined) composition ratio, where the composition ratio may be defined as the volume or thickness of the first material relative to the volume or thickness of the second material.

For example, the first material may be included (e.g., in the photoelectric conversion layer 130) in a smaller amount than the second material. For example, the composition ratio of the first material to the second material (e.g., in the photoelectric conversion layer 130) may be about 0.10:1 to about 0.90:1. The composition ratio of the first material to the second material may be, within the above range, about 0.10:1 to about 0.80:1, about 0.10:1 to about 0.70:1, about 0.10:1 to about 0.50:1, or about 0.10:1 to about 0.30:1. In this way, by relatively increasing the composition ratio of the second material having a relatively deeper HOMO energy level than the first material in the photoelectric conversion layer 130, it is possible to form an energy barrier that reduces, minimizes, or prevents reverse inflow of charge to photoelectric conversion layer 130 from anode 110 or cathode 120 at a reverse voltage, thereby suppressing dark current and thus improving the functionality (e.g., photoelectric conversion performance and/or power consumption efficiency) of the infrared photodiode 100 and any device including same.

The first auxiliary layer 140 disposed between the anode 110 and the photoelectric conversion layer 130, and the second auxiliary layer 150 disposed between the cathode 120 and the photoelectric conversion layer 130, may each independently contain an electron transporting material. That is, the first auxiliary layer 140 and the second auxiliary layer 150 may each be an electron injecting layer (EIL), an electron transporting layer (ETL), and/or a hole blocking layer (HBL), which may contain identical or different materials that facilitate the injection of electrons, facilitate the transport of electrons, and/or inhibit the movement of holes. Accordingly, the first auxiliary layer 140 and the second auxiliary layer 150 may each independently include an electron transport material (which may be the same or different material between the first auxiliary layer 140 and the second auxiliary layer 150) that is configured to facilitate the injection of electrons, facilitate the transport of electrons, and/or inhibit the movement of holes.

In conventional photodiodes, a hole injecting layer (HIL), a hole transporting layer (HTL), and/or an electron blocking layer (EBL), which contains a material that facilitates the injection of holes and/or transport of holes, and/or prevent the movement of electrons, are disposed between the anode 110 and the photoelectric conversion layer 130, and an electron injecting layer (EIL), an electron transporting layer (ETL), and/or a hole blocking layer (HBL), which contains a material that facilitates the injection of electrons and/or transport of electrons, and/or prevents the movement of holes, are disposed between the cathode 120 and the photoelectric conversion layer 130.

However, the infrared photodiode 100 according to some example embodiments includes a first auxiliary layer 140 disposed between the anode 110 and the photoelectric conversion layer 130, and a second auxiliary layer 150 disposed between the cathode 120 and the photoelectric conversion layer 130, both of which include an electron transport material that facilitates the injection of electrons, facilitates the transport of electrons, and/or prevents (e.g., inhibits) the movement of holes. An infrared photodiode 100 that includes a first auxiliary layer 140 and a second auxiliary layer both of which include an electron transport material was not known before the priority date of the application.

A conventional photodiode has a hole injection layer (HIL), a hole transporting layer (HTL), and/or an electron blocking layer (EBL) between the anode 110 and the photoelectric conversion layer 130, and an electron injecting layer (EIL), an electron transporting layer (ETL), and/or a hole blocking layer (HBL) between the cathode 120 and the photoelectric conversion layer 130. As such, the conventional photodiode disposes a material layer that assists the injection and/or movement of holes between the anode 110 and the photoelectric conversion layer 130, and a material layer that assists the transport or movement of electrons between the cathode 120 and the photoelectric conversion layer 130, whereby the holes and electrons separated from the photoelectric conversion layer 130 are facilitated to move to the anode 110 and the cathode 120, respectively, resulting in a low driving voltage, which was thought that excellent photoelectric conversion efficiency could be achieved.

On the other hand, when both the first auxiliary layer 140 and the second auxiliary layer 150 of the infrared photodiode according to some example embodiments include an electron transport material, the number of holes from the photoelectric conversion layer 130 to the anode 110 (e.g., the number of holes moving (e.g., injected and/or transported) from the photoelectric conversion layer 130 to the anode 110) may be reduced. As injection and/or transport of holes might not be smooth, it might have previously been expected that a higher driving voltage would be required to drive such an infrared photodiode, and/or the photoelectric conversion efficiency obtained therefrom would be low. However, surprisingly and unexpectedly, it has been discovered that the infrared photodiode 100 according to some example embodiments, where both the first auxiliary layer 140 and the second auxiliary layer 150 of the infrared photodiode 100 include an electron transport material (e.g., each independently include an electron transport material), exhibits significantly superior photoelectric conversion efficiency, for example, a significantly higher external quantum efficiency (EQE) of the infrared photodiode 100 according to some example embodiments was obtained under an equivalent driving voltage, compared to a conventional infrared photodiode that includes a hole injection layer, a hole transport layer, and/or an electron blocking layer as a first auxiliary layer, and an electron injection layer, an electron transport layer, and/or a hole blocking layer as a second auxiliary layer. Although not intended to be bound by a specific theory, the effect of the infrared photodiode 100 according to some example embodiments may be that the holes separated from the photoelectric conversion layer 130 and injected into the first auxiliary layer 140 are not able to be directly injected into the anode 110, but stay in the first auxiliary layer 140 and accumulate, and then suddenly be injected or moved to the anode 110 at once at above a certain driving voltage, i.e., due to a light amplification phenomenon.

As can be seen from the examples and comparative examples described later, a conventional infrared photodiode having a hole injection layer, a hole transport layer, and/or an electron blocking layer in the first auxiliary layer 140, and an electron injection layer, an electron transport layer, and/or a hole blocking layer in the second auxiliary layer 150, does not exhibit light amplification, even when the driving voltage is increased, and maintains an almost constant EQE. On the contrary, the infrared photodiode 100 according to some example embodiments may exhibit a light amplification phenomenon in which the theoretical external quantum efficiency (EQE) exceeds 100% above a certain driving voltage applied thereto (e.g., the infrared photodiode 100 may be configured to exhibit light amplification in response to a driving voltage applied to the infrared photodiode 100, for example applied between the anode 110 and the cathode 120, being equal to or greater than a specific driving voltage magnitude), thereby achieving the effect of significantly increasing the EQE. The infrared photodiode 100 may be configured to exhibit such a light amplification phenomenon based on both the first auxiliary layer 140 and the second auxiliary layer 150 of the infrared photodiode 100 including an electron transport material (e.g., each independently include an electron transport material).

Referring to FIG. 1, an infrared photodiode 100 that includes the first auxiliary layer 140 and the second auxiliary layer 150 that both independently include an electron transport material may, in some example embodiments, omit any hole injection layer, any hole transport layer, and any electron blocking layer in the infrared photodiode 100. In some example embodiments, the first auxiliary layer 140 that includes an electron transport material may be directly between the anode 110 and the photoelectric conversion layer 130 (and in direct contact with the anode 110 and the photoelectric conversion layer 130 at opposite surfaces of the first auxiliary layer 140). In some example embodiments, the second auxiliary layer 150 that includes an electron transport material may be directly between the cathode 120 and the photoelectric conversion layer 130 (and in direct contact with the cathode 120 and the photoelectric conversion layer 130 at opposite surfaces of the second auxiliary layer 150).

Meanwhile, the light amplification phenomenon of the infrared photodiode 100 according to some example embodiments may be affected by the thickness of the first auxiliary layer 140. For example, when a thickness of the first auxiliary layer 140 is too thin, for example, when the thickness of the first auxiliary layer 140 is about 3 nm or less, holes separated from the photoelectric conversion layer 130 and injected to a first auxiliary layer 140 cannot stay in the first auxiliary layer 140 and would immediately flow into the anode 110 even at a low driving voltage. On the other hand, when the thickness of the first auxiliary layer 140 becomes too thick, for example, when the thickness of the first auxiliary layer 140 is about 50 nm or more, a driving voltage for moving the holes accumulated in the first auxiliary layer 140 to the anode 110 may become too high. Accordingly, a thickness of the first auxiliary layer 140 disposed between the anode 110 and the photoelectric conversion layer 130 of the infrared photodiode according to some example embodiments may be greater than about 3 nm and less than about 50 nm, but is not limited thereto.

For example, a thickness of the first auxiliary layer 140 may depend on the type of electron transport material constituting the first auxiliary layer 140 (e.g., the first electron transport material), the type of electron transport material constituting the second auxiliary layer 150 (e.g., the second electron transport material), and/or a thickness of the second auxiliary layer 150. Additionally, the thickness of the first auxiliary layer 140 may vary depending on the types of the first and second materials included in the photoelectric conversion layer 130 and the thickness of the photoelectric conversion layer 130, and may also vary depending on the driving voltage. Accordingly, a person skilled in the art may appropriately select the above-described factors to appropriately select the thickness of the first auxiliary layer 140, and/or the electron transport material suitable for light amplification to occur at a low driving voltage.

For example, a thickness of the first auxiliary layer 140 may be from about 4 nm to less than about 50 nm, from about 5 nm to less than about 50 nm, from about 7 nm to less than about 50 nm, from about 9 nm to less than about 50 nm, from about 10 nm to less than about 50 nm, from about 12 nm to less than about 50 nm, from about 15 nm to less than about 50 nm, from about 17 nm to less than about 50 nm, from about 20 nm to less than about 50 nm, from about 22 nm to less than about 50 nm, from about 25 nm to less than about 50 nm, from about 6 nm to about 48 nm, from about 6 nm to about 46 nm, from about 6 nm to about 44 nm, from about 8 nm to about 48 nm, from about 8 nm to about 46 nm, from about 8 nm to about 44 nm, from about 8 nm to about 42 nm, from about 10 nm to about 48 nm, from about 10 nm to about 46 nm, from about 10 nm to about 44 nm, from about 10 nm to about 42, from about 10 nm to about 40 nm, from about 10 nm to about 38 nm, from about 10 nm to about 36 nm, from about 10 nm to about 35 nm, from about 10 nm to about 33 nm, from about 10 nm to about 30 nm, from about 10 nm to about 28 nm, from about 10 nm to about 26 nm, from about 10 nm to about 25 nm, from about 10 nm to about 23 nm, from about 10 nm to about 22 nm, from about 10 nm to about 20 nm, from about 10 nm to about 18 nm, or from about 10 nm to about 15 nm, but is not limited thereto.

A thickness of the second auxiliary layer 150 may appropriately be adjusted considering the thickness of the first auxiliary layer 140. For example, the thickness of the second auxiliary layer 150 may be from about 1 nm to about 50 nm, but is not limited to this range. The second auxiliary layer 150, like a conventional photodiode, may contain a material that may assist transport of movement of electrons between the photoelectric conversion layer 130 and the cathode 120. Accordingly, the thickness of the second auxiliary layer 150 may be appropriately adjusted in order for the electrons and holes separated from the photoelectric conversion layer 130 to be finally balanced and move to the anode 110 and cathode 120, respectively.

For example, the thickness of the second auxiliary layer 150 may be from about 1 nm to about 50 nm, for example, from about 2 nm to about 50 nm, from about 3 nm to about 50 nm, from about 3 nm to about 45 nm, from about 3 nm to about 40 nm, from about 3 nm to about 35 nm, from about 3 nm to about 30 nm, from about 3 nm to about 25 nm, from about 3 nm to about 20 nm, from about 3 nm to about 15 nm, from about 5 nm to about 50 nm, from about 5 nm to about 45 nm, from about 5 nm to about 40 nm, from about 5 nm to about 35 nm, from about 5 nm to about 30 nm, from about 5 nm to about 25 nm, from about 5 nm to about 20 nm, from about 5 nm to about 15 nm, or from about 5 nm to about 10 nm, but is not limited thereto.

The electron transport materials included in the first auxiliary layer 140 and the second auxiliary layer 150 may be the same or different from each other. For example, the first auxiliary layer 140 may include a first electron transport material and the second auxiliary layer 150 may include a second electron transport material, and the first and second electron transport materials may be the same material (e.g., separate instances of the same material) or different materials from each other. For example, the electron transport material included in the first auxiliary layer 140 may be a first electron transport material and the electron transport material included in the second auxiliary layer 150 may be a second electron transport material, and the first and second electron transport materials may be the same material (e.g., separate instances of the same material) or different materials from each other.

The electron transport material (e.g., the first electron transport material and/or the second transport material) may be any material that facilitates (e.g., is configured to facilitate) electron injection and/or transport and/or is configured to reduce, minimize, or prevent (e.g., inhibit) hole movement, and is not limited to a specific example. For example, the electron transport material may be an organic compound that is able to be deposited, and may include any organic compound known in the art to be able to be deposited and favor the injection and/or transport of electrons.

For example, the electron transport material of the first auxiliary layer 140 (e.g., the first electron transport material) may have the same bandgap energy as that of the electron transport material of the second auxiliary layer 150 (e.g., the second electron transport material), or the electron transport material of the first auxiliary layer 140 (e.g., the first electron transport material) may have a smaller bandgap energy than the electron transport material of the second auxiliary layer 150 (e.g., the second electron transport material).

For example, the bandgap energy of the electron transport material of the first auxiliary layer 140 (e.g., the first electron transport material) may be in a range of from about 2.5 eV to about 3.5 eV, for example, from about 2.7 eV to about 3.5 eV, for example, from about 3.0 eV to about 3.5 eV, and the bandgap energy of the electron transport material of the second auxiliary layer 150 (e.g., the second electron transport material) may be in a range of from about 3.0 eV to about 3.5 eV, for example, from about 3.1 eV to about 3.5 eV, for example, from about 3.2 eV to about 3.5 eV, or for example, from about 3.3 eV to about 3.5 eV, but is not limited to these ranges. When the bandgap energy of the electron transport material of the first auxiliary layer 140 and the second auxiliary layer 150 (e.g., the first electron transport material and the second electron transport material) is within the above range, the infrared photodiode according to some example embodiments may provide excellent photoelectric conversion efficiency through light amplification at a relatively low driving voltage and thus the infrared photodiode 100 may have improved functionality, including improved photoelectric conversion performance of the infrared photodiode 100 without increased power consumption thereof and/or reduced power consumption of the infrared photodiode 100 without compromising photoelectric conversion performance thereof.

Also, for example, the HOMO (Highest Occupied Molecular Orbital) energy of the electron transport material of the first auxiliary layer 140 (e.g., the first electron transport material) may be from about 5.5 eV to about 7.5 eV, for example, from about 6.0 eV to about 7.5 eV, from about 6.5 eV to about 7.5 eV, or may range from about 7.0 eV to about 7.5 eV. When the HOMO energy of the electron transport material of the first auxiliary layer 140 is in the above range, the infrared photodiode according to some example embodiments may exhibit excellent photoelectric conversion efficiency by light amplification at a relatively low driving voltage and thus the infrared photodiode 100 may have improved functionality, including improved photoelectric conversion performance of the infrared photodiode 100 without increased power consumption thereof and/or reduced power consumption of the infrared photodiode 100 without compromising photoelectric conversion performance thereof.

For example, the LUMO (Lowest Unoccupied Molecular Orbital) energy of the electron transport material of the second auxiliary layer 150 (e.g., the second electron transport material) may be from about 2.5 eV to about 4.5 eV, for example, from about 3.0 eV to about 4.5 eV, from about 3.5 eV to about 4.5 eV, or from about 4.0 eV to about 4.5 eV. When the LUMO energy of the electron transport material of the second auxiliary layer 150 is in the above range, it is advantageous to balance the HOMO energy of the electron transport material of the first auxiliary layer 140, and accordingly, in some example embodiments, the infrared photodiode according to the present inventive concepts may exhibit excellent photoelectric conversion efficiency by light amplification at a relatively low driving voltage and thus the infrared photodiode 100 may have improved functionality, including improved photoelectric conversion performance of the infrared photodiode 100 without increased power consumption thereof and/or reduced power consumption of the infrared photodiode 100 without compromising photoelectric conversion performance thereof.

In some example embodiments, the electron transport material (e.g., at least one of the first electron transport material or the second electron transport material) may include one or more of the compounds represented by Chemical Formulas 1 to 5, and fullerenes (e.g., fullerene):

Chemical Formula 1

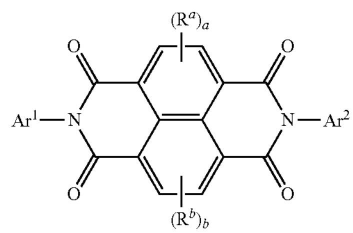

In Chemical Formula 1, $Ar^1$ and $Ar^2$ may each independently be a substituted or unsubstituted C10 to C30 aryl group or a substituted or unsubstituted C2 to C30 heteroaryl group, $R^a$ and $R^b$ may each independently be hydrogen, deuterium, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C20 aryl group, a substituted or unsubstituted C6 to C20 aryloxy group, a substituted or unsubstituted C3 to C20 heteroaryl group, a substituted or unsubstituted C3 to C20 cycloalkyl group, a substituted or unsubstituted C3 to C20 heterocycloalkyl group, or any combination thereof, and a and b may each independently be integers of 1 or 2, Chemical Formula 2

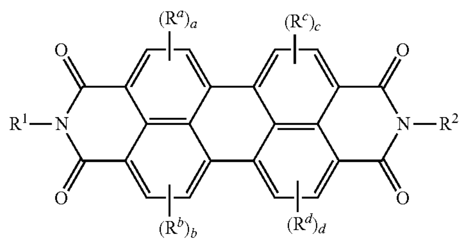

wherein, in Chemical Formula 2, $R^1$ and $R^2$ may each independently be hydrogen, deuterium, a substituted or unsubstituted C6 to C30 aryl group, or a substituted or unsubstituted C3 to C30 heteroaryl group, $R^a$ to $R^d$ may each independently be hydrogen, deuterium, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C20 aryl group, a substituted or unsubstituted C6 to C20 aryloxy group, a substituted or unsubstituted C3 to C20 heteroaryl group, a substituted or unsubstituted C3 to C20 cycloalkyl group, a substituted or unsubstituted C3 to C20 heterocycloalkyl group, or any combination thereof, and a to d may each independently be an integer of 1 or 2, Chemical Formula 3

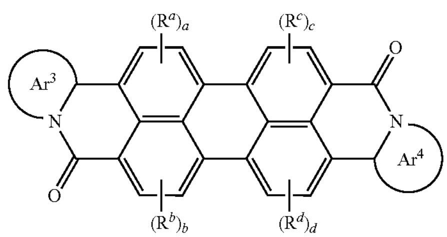

Chemical Formula 4

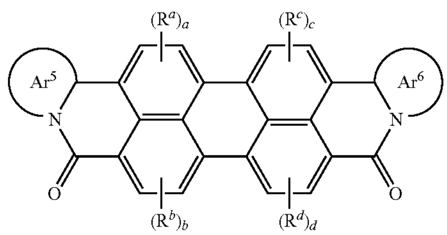

wherein, in Chemical Formulas 3 and 4, $Ar^3$ to $Ar^6$ may each independently be hydrogen, a substituted or unsubstituted C6 to C30 arene group, or a substituted or unsubstituted C3 to C30 heteroarene group, $R^a$ to $R^d$ may each independently be hydrogen, deuterium, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C20 aryl group, a substituted or unsubstituted C6 to C20 aryloxy group, a substituted or unsubstituted C3 to C20 heteroaryl group, a substituted or unsubstituted C3 to C20 cycloalkyl group, a substituted or unsubstituted C3 to C20 heterocycloalkyl group, or any combination thereof, and a to d may each independently be an integer of 1 or 2, Chemical Formula 5

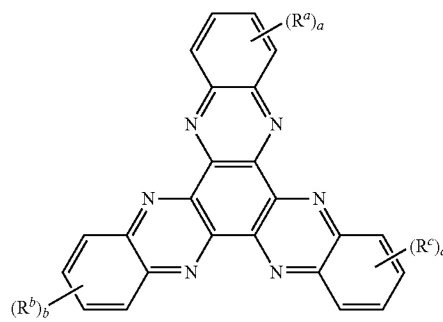

wherein, in Chemical Formula 5, $R^a$ to $R^c$ may each independently be hydrogen, deuterium, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C20 aryl group, a substituted or unsubstituted C6 to C20 aryloxy group, a substituted or unsubstituted C3 to C20 heteroaryl group, a substituted or unsubstituted C3 to C20 cycloalkyl group, a substituted or unsubstituted C3 to C20 heterocycloalkyl group, or any combination thereof, and a to c may each independently be an integer of 1 to 4.

In Chemical Formula 1, when $Ar^1$ and $Ar^2$ are an alkyl group or a cycloalkyl group, a desired level of photoelectric conversion efficiency cannot be obtained in the infrared wavelength range.

In Chemical Formula 1, $Ar^1$ and $Ar^2$ may be the same or different from each other.

In Chemical Formula 1, $Ar^1$ and $Ar^2$ may each independently be a functional group represented by any one of Chemical Formulas 5A to 5K.

Chemical Formulas 5A to 5K (5A)

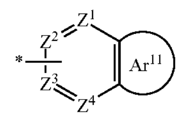

(5B)

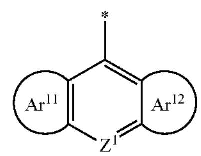

-continued (5C)

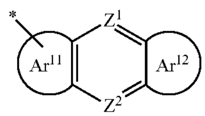

(5D)

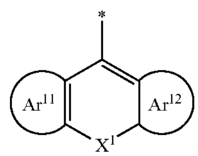

(5E)

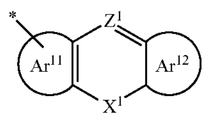

(5F)

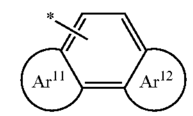

(5G)

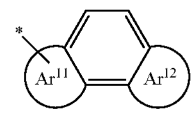

(5H)

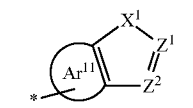

(5I)

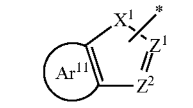

(5J)

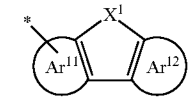

(5K)

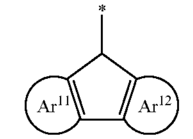

In Chemical Formulas 5A to 5K, $X^1$ may be O, S, Se, Te, S(═O), S(═O)$_2$, $NR^a$, $SiR^bR^c$, or $GeR^dR^e$, wherein $R^a$, $R^b$, $R^c$, $R^d$, and $R^e$ are each independently hydrogen, deuterium, a C1 to C10 alkyl group, a C6 to C14 aryl group, a C3 to C12 heteroaryl group, or any combination thereof, $Z^1$ to $Z^4$ are each independently $CR^x$ or N (wherein $R^x$ is hydrogen, deuterium, A C1 to C10 alkyl group, a C6 to C14 aryl group, a C3 to C12 heteroaryl group, or any combination thereof), provided that in Chemical Formula 5A, one of $Z^1$ to $Z^4$ is $CR^x$ wherein $R^x$ is a single bond, and in Chemical Formula 5I, one of $Z^1$ or $Z^2$ is $CR^x$ wherein $R^x$ is a single bond, $Ar^{11}$ and $Ar^{12}$ may each independently be a substituted or unsubstituted C6 to C20 arene group (e.g., a substituted or unsubstituted C6 to C14 arene group) or a substituted or unsubstituted C2 to C20 heteroarene group (e.g., a substituted or unsubstituted C2 to C10 heteroarene group), hydrogen of each aromatic ring or heteroaromatic ring may be replaced by deuterium, a C1 to C10 alkyl group, a C1 to C10 alkoxy group, a C6 to C10 aryl group, a C6 to C10 aryloxy group, or any combination thereof (e.g., at least one hydrogen of each aromatic ring or heteroaromatic ring may be present or may be replaced by deuterium, a C1 to C10 alkyl group, a C1 to C10 alkoxy group, a C6 to C10 aryl group, a C6 to C10 aryloxy group, or any combination thereof), —$CH_2$— of each aromatic ring or heteroaromatic ring may be replaced by —N— (e.g., at least one —$CH_2$— of each aromatic ring or heteroaromatic ring may be present or may be replaced by —N—), and

* is a linking point with Chemical Formula 1.

In Chemical Formula 1, $Ar^1$ and $Ar^2$ may each independently be a functional group represented by one of Chemical Formulas 6A to 6I.

Chemical Formulas 6A to 6I (6A)

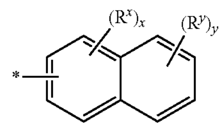

(6B)

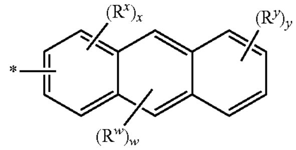

(6C)

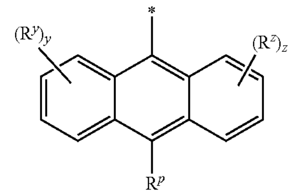

(6D)

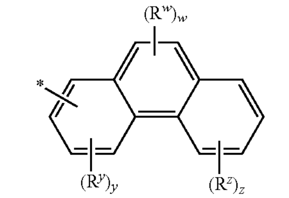

(6E)

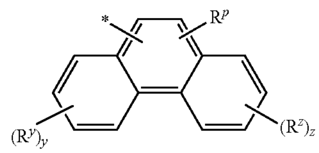

(6F)

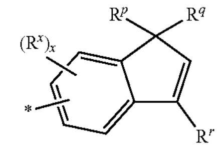

(6G)

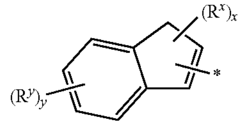

-continued (6H)

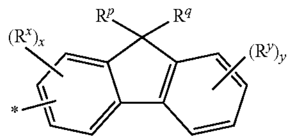

(6I)

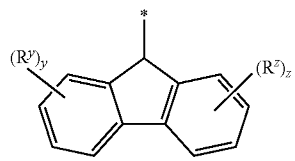

In Chemical Formulas 6A to 6I, $R^x$, $R^y$, $R^z$, $R^w$, $R^p$, $R^q$, and $R^r$ may each independently be hydrogen, deuterium, a C1 to C10 alkyl group, a C6 to C14 aryl group, a C3 to C12 heteroaryl group, or any combination thereof, wherein $R^p$ and $R^q$ may each independently be present or be linked to each other to form a spiro structure, x is an integer from 0 to 3, y and z are each independently integers from 0 to 4, w is an integer from 0 to 2, and

* is a linking point with Chemical Formula 1.

In Chemical Formula 1, $Ar^1$ and $Ar^2$ may each independently be a functional group represented by one of Chemical Formulas 7A to 7Q.

Chemical Formulas 7A to 7Q (7A)

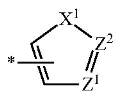

(7B)

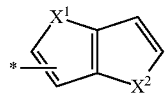

(7C)

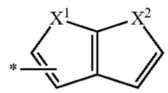

(7D)

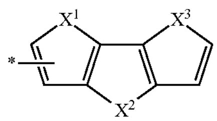

(7E)

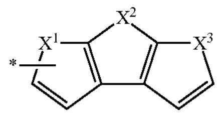

(7F)

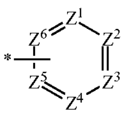

(7G)

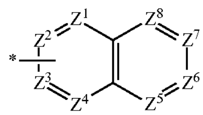

-continued (7H)

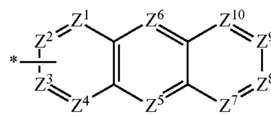

(7I)

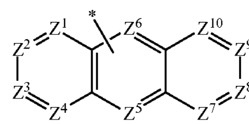

(7J)

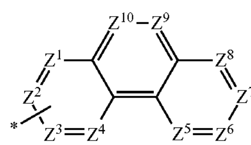

(7K)

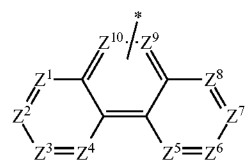

(7L)

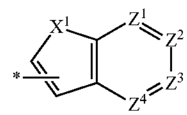

(7M)

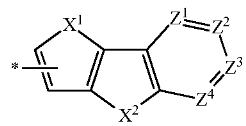

(7N)

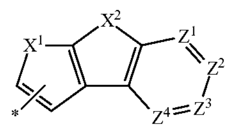

(7O)

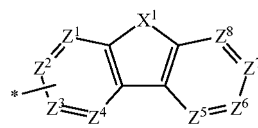

(7P)

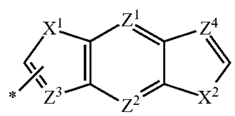

(7Q)

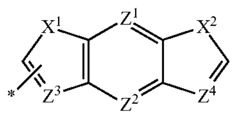

In Chemical Formulas 7A to 7Q, $X^1$, $X^2$, and $X^3$ may each independently be O, S, Se, Te, S(═O), $S(═O)_2$, $NR^a$, $SiR^bR^c$, or $GeR^dR^e$, wherein $R^a$, $R^b$, $R^c$, $R^d$, and $R^e$ are each independently hydrogen, deuterium, a C1 to C10 alkyl group, a C6 to C14 aryl group, a C3 to C12 heteroaryl group, or any combination thereof, $Z^1$ to $Z^{10}$ may each independently be $CR^x$ or N (wherein $R^x$ may be hydrogen, deuterium, a C1 to C10 alkyl group, a C6 to C14 aryl group, a C3 to C12 heteroaryl group, or any combination thereof), provided that when in Chemical Formula 7F, one of $Z^1$ to $Z^6$ is a linking point with Chemical Formula 1, one of $Z^1$ to $Z^6$ is $CR^x$ wherein $R^x$ is a single bond; when in Chemical Formulas 7G, 7H, and 7J, one of $Z^1$ to $Z^4$ is a linking point with Chemical Formula 1, one of $Z^1$ to $Z^4$ is $CR^x$ wherein $R^x$ is a single bond; when in Chemical Formula 71, one of $Z^5$ to $Z^6$ is a linking point with Chemical Formula 1, one of $Z^5$ or $Z^6$ is $CR^x$ wherein $R^x$ is a single bond; when in Chemical Formula 7K, one of $Z^9$ or $Z^{10}$ is a linking point with Chemical Formula 1, one of $Z^9$ or $Z^{10}$ is $CR^x$ wherein $R^x$ is a single bond; when in Chemical Formulas 7P and 7Q, $Z^3$ is a linking point with Chemical Formula 1, $Z^3$ is $CR^x$ wherein $R^x$ is a single bond, at least one hydrogen of each aromatic ring or heteroaromatic ring may be present or may be replaced by deuterium, a C1 to C10 alkyl group, a C1 to C10 alkoxy group, a C6 to C10 aryl group, a C6 to C10 aryloxy group, or any combination thereof, at least one —$CH_2$— of each aromatic ring or heteroaromatic ring may be replaced by —N— (e.g., is present or is replaced by —N—), and

* is a linking point with Chemical Formula 1.

In Chemical Formula 1, $Ar^1$ and $Ar^2$ may each independently be a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyrimidinyl group, a substituted or unsubstituted quinolinyl group, a substituted or unsubstituted isoquinolinyl group, a substituted or unsubstituted quinoxalinyl group, a substituted or unsubstituted quinazolinyl group, a substituted or unsubstituted phenanthrolyl group, a substituted or unsubstituted pyrrolyl group, a substituted or unsubstituted thienyl group, a substituted or unsubstituted indolyl group a substituted or unsubstituted benzimidazolyl group, a substituted or unsubstituted benzthiazolyl group, or a substituted or unsubstituted carbazolyl group. Herein, “substituted” refers to replacement by a substituent selected from a halogen, a substituted or unsubstituted C6 to C20 aryl group, for example a substituted or unsubstituted C6 to C10 aryl group, a substituted or unsubstituted C6 to C20 aryloxy group, for example a substituted or unsubstituted C6 to C10 aryloxy group, a substituted or unsubstituted C3 to C20 heteroaryl group, for example a substituted or unsubstituted C3 to C10 heteroaryl group, or any combination thereof.

The compound of Chemical Formula 1 may be any one of the compounds represented by Group 1.

[Group 1]

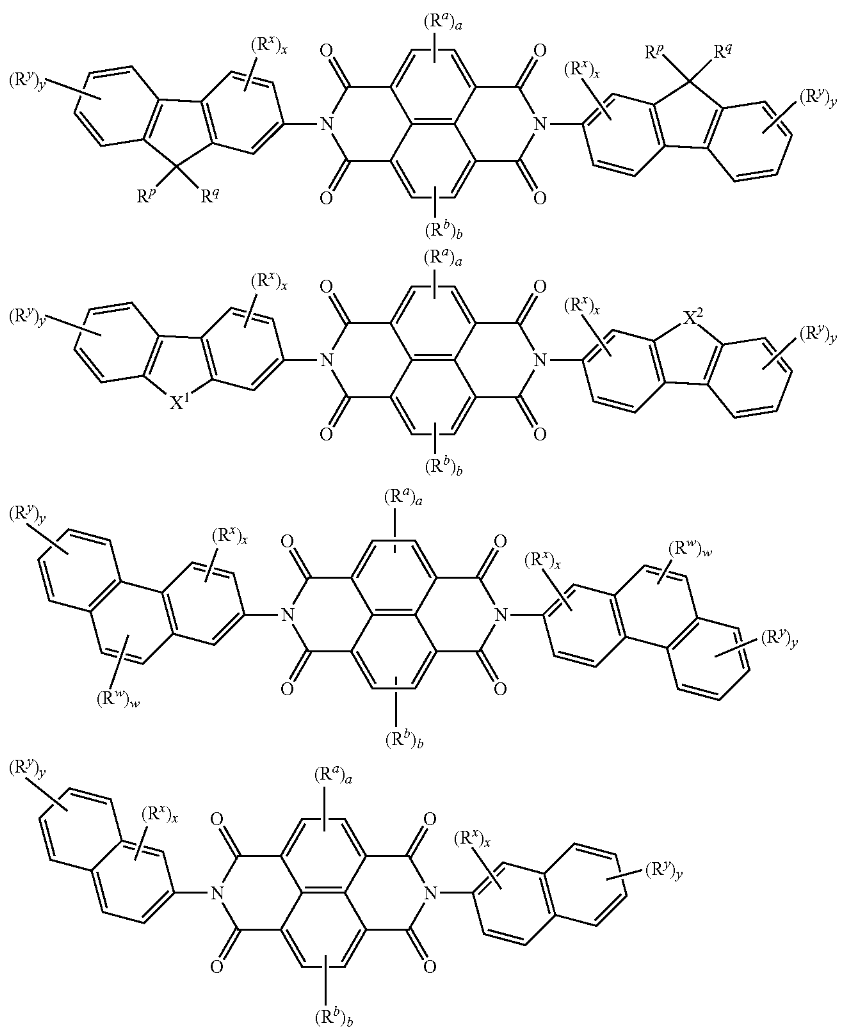

-continued

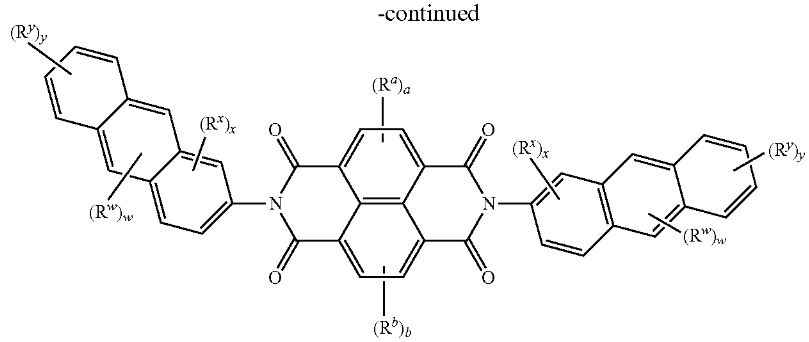

In Group 1, $R^a$, $R^b$, a, and b are the same as $R^a$, $R^b$, a, and b, respectively, in Chemical Formula 1, $R^x$, $R^y$, $R^w$, $R^p$, and $R^q$ may each independently be hydrogen, deuterium, a C1 to C10 alkyl group, a C6 to C14 aryl group, a C3 to C12 heteroaryl group, or any combination thereof, wherein $R^p$ and $R^q$ may each independently be present or be linked to each other to form a spiro structure, $X^1$ and $X^2$ may each independently be O, S, Se, Te, S(=O), S(=O)$_2$, $NR^a$, $SiR^bR^c$, or $GeR^dR^e$, wherein $R^a$, $R^b$, $R^c$, $R^d$, and $R^e$ are each independently hydrogen, deuterium, a C1 to C10 alkyl group, a C6 to C14 aryl group, a C3 to C12 heteroaryl group, or any combination thereof, x is an integer from 0 to 3, y is an integer from 0 to 4, and w is an integer from 0 to 2.

$CR^x$, $CR^y$, and $CR^w$ present in each aromatic ring in Group 1 may be replaced by N.

In Chemical Formula 2, when $R^1$ and $R^2$ may be an alkyl group or a cycloalkyl group, a desired level of photoelectric conversion efficiency cannot be obtained in the infrared wavelength range.

In Chemical Formula 2, $R^1$ and $R^2$ may be the same or different from each other.

In Chemical Formula 2, $R^1$ and $R^2$ may each independently be a functional group represented by one of Chemical Formulas 5A to 5L.

Chemical Formulas 5A to 5L (5A)

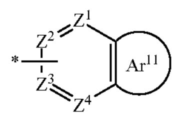

(5B)

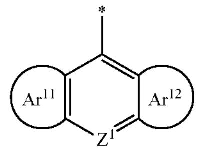

(5C)

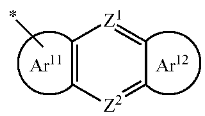

(5D)

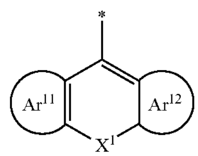

-continued (5E)

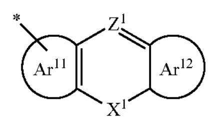

(5F)

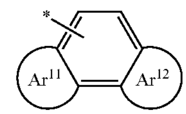

(5G)

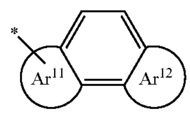

(5H)

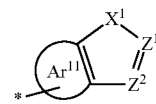

(5I)

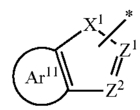

(5J)

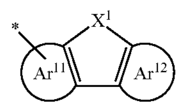

(5K)

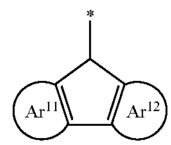

(5L)

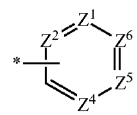

In Chemical Formulas 5A to 5L, $X^1$ may be O, S, Se, Te, S(=O), S(=O)$_2$, $NR^a$, $SiR^bR^c$, or $GeR^dR^e$, wherein $R^a$, $R^b$, $R^c$, $R^d$, and $R^e$ are each independently hydrogen, deuterium, a C1 to C10 alkyl group, a C6 to C14 aryl group, a C3 to C12 heteroaryl group, or any combination thereof, $Z^1$ to $Z^6$ may each independently be $CR^x$ or N, wherein $R^x$ may be hydrogen, deuterium, a C1 to C10 alkyl group, a C6 to C14 aryl group, a C3 to C12 heteroaryl group, or any combination thereof, provided that in Chemical Formula 5A, one of $Z^1$ to $Z^4$ is $CR^x$ wherein $R^x$ is a single bond, in Chemical Formula 5I, one of $Z^1$ or $Z^2$ is $CR^x$ wherein $R^x$ is a single bond, and in Chemical Formula 5L, one of $Z^1$ to $Z^6$ is $CR^x$ wherein $R^x$ is a single bond, $Ar^{11}$ and $Ar^{12}$ may each independently be a substituted or unsubstituted C6 to C20 arene group or a substituted or unsubstituted C2 to C20 heteroarene group, at least one hydrogen of each aromatic ring or heteroaromatic ring may be present or may be replaced by deuterium, a C1 to C10 alkyl group, a C1 to C10 alkoxy group, a C6 to C10 aryl group, a C6 to C10 aryloxy group, or any combination thereof, at least one —$CH_2$— of each aromatic ring or heteroaromatic ring may be present or may be replaced by —N—, and

* is a linking point with Chemical Formula 2.

In Chemical Formula 2, $R^1$ and $R^2$ may each independently be a functional group represented by one of Chemical Formulas 6A to 6J.

Chemical Formulas 6A to 6J (6A)

(6B)

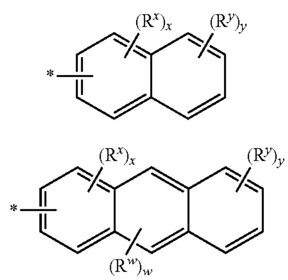

(6C)

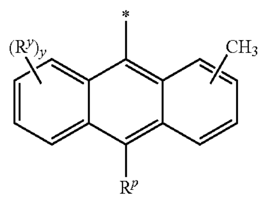

(6D)

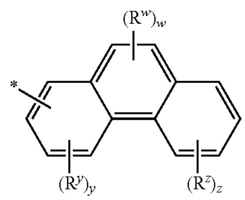

-continued (6E)

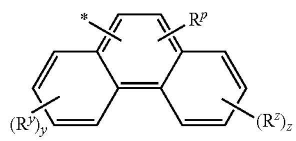

(6F)

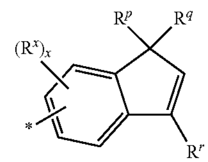

(6G)

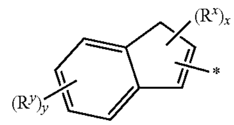

(6H)

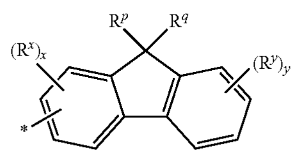

(6I)

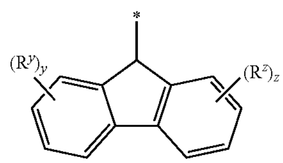

(6J)

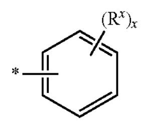

In Chemical Formulas 6A to 6J, $R^x$, $R^y$, $R^z$, $R^w$, $R^p$, $R^q$, and $R^r$ may each independently be hydrogen, deuterium, a C1 to C10 alkyl group, a C6 to C14 aryl group, a C3 to C12 heteroaryl group, or any combination thereof, wherein $R^p$ and $R^q$ may each independently be present or be linked to each other to form a spiro structure, x is an integer from 0 to 3, y and z are each independently integers from 0 to 4, w is an integer from 0 to 2, and

* is a linking point with Chemical Formula 2.

The compound represented by Chemical Formula 2 may be one or more of the compounds represented by Group 2:

[Group 2]

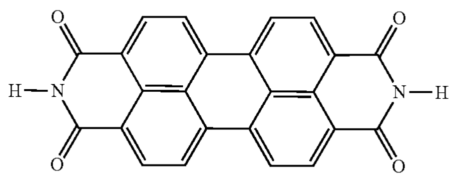

-continued

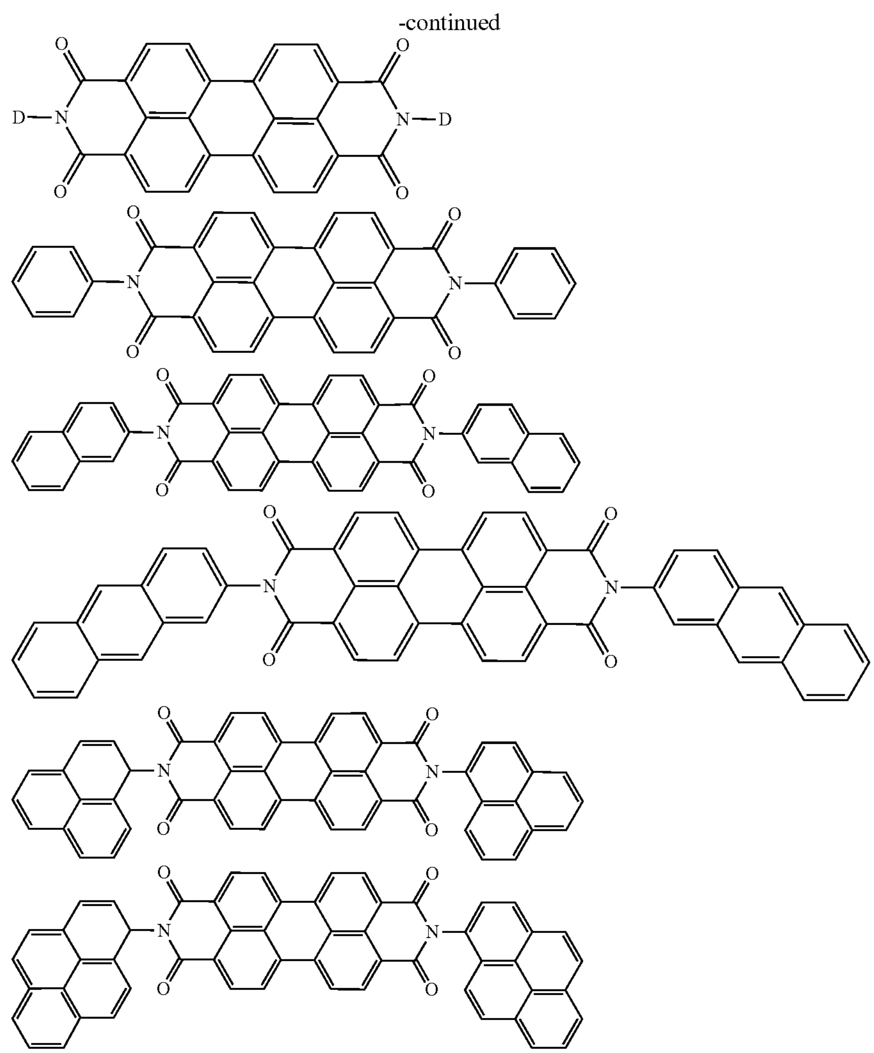

In Group 2, at least one hydrogen of each aromatic ring or heteroaromatic ring may be present or may be replaced by deuterium, a C1 to C10 alkyl group, a C1 to C10 alkoxy group, a C6 to C10 aryl group, a C6 to C10 aryloxy group, or any combination thereof, and at least one —$CH_2$— of each aromatic ring or heteroaromatic ring may be present or may be replaced by —N—.

The compound of Chemical Formula 3 may be one of the compounds represented by Group 3 (any one of Chemical Formulas 3-1 to 3-9).

Group 3

(3-1)

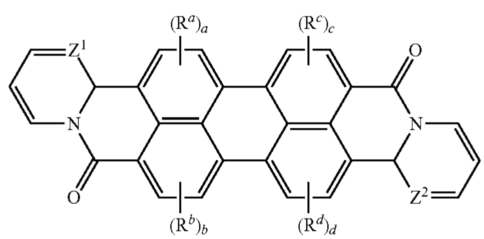

-continued (3-2)

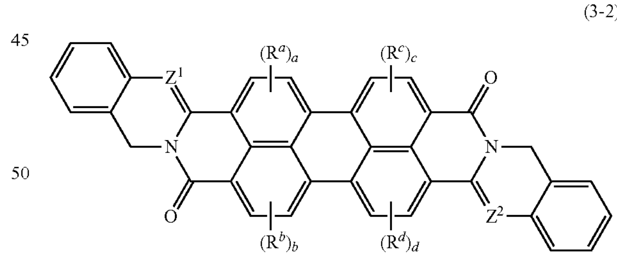

(3-3)

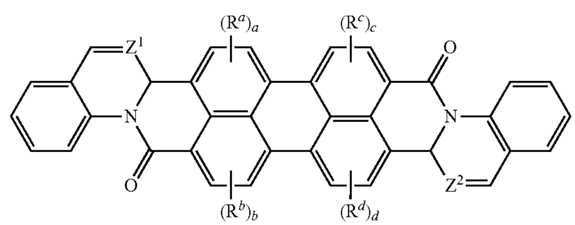

-continued (3-4)

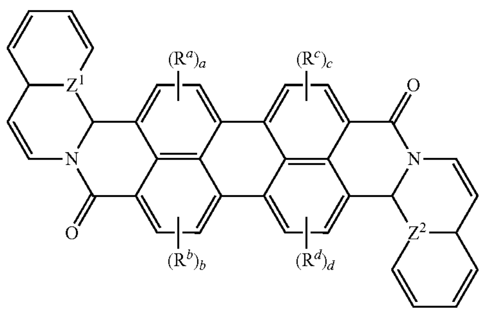

(3-5)

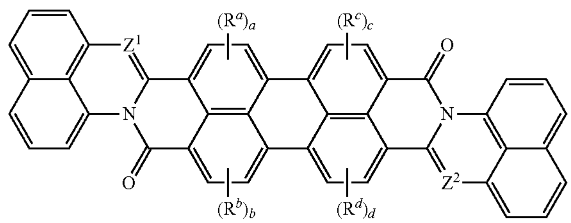

(3-6)

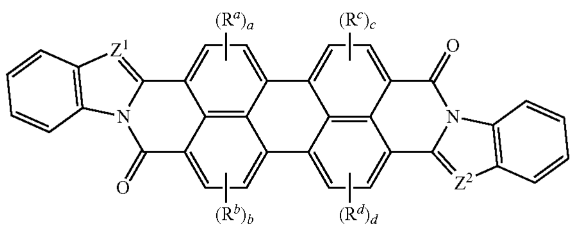

(3-7)

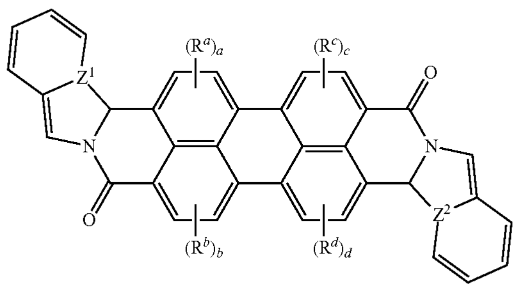

(3-8)

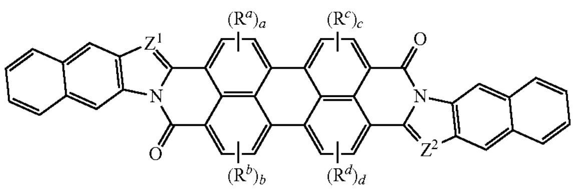

-continued (3-9)

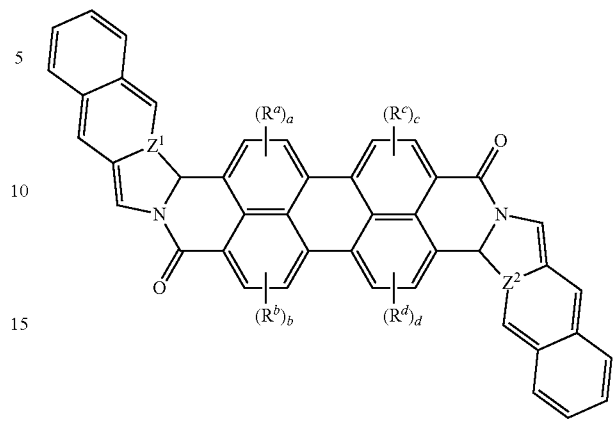

In Group 3 (Chemical Formulas 3-1 to 3-9), $R^a$, $R^b$, $R^c$, $R^d$, a, b, c, and d are the same as $R^a$, $R^b$, $R^c$, $R^d$, a, b, c, and d, respectively, in Chemical Formula 3, $Z^1$ and $Z^2$ are each independently $CR^x$ or N, wherein $R^x$ is hydrogen, deuterium, A C1 to C10 alkyl group, a C6 to C14 aryl group, a C3 to C12 heteroaryl group, or any combination thereof, at least one hydrogen of each aromatic ring or heteroaromatic ring may be present or may be replaced by deuterium, a C1 to C10 alkyl group, a C1 to C10 alkoxy group, a C6 to C10 aryl group, a C6 to C10 aryloxy group, or any combination thereof, and at least one —$CH_2$— of each aromatic ring or heteroaromatic ring may be present or may be replaced by —N—.

The compounds of Group 3 may include, for example, a compound represented by Chemical Formula 3-1A and a compound represented by Chemical Formula 3-2A:

Chemical Formula 3-1A

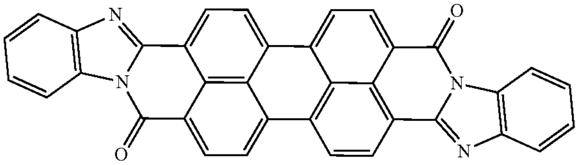

Chemical Formula 3-2A

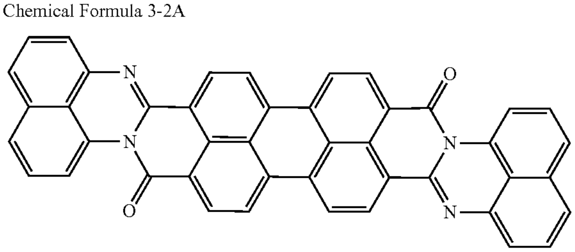

The compound represented by Chemical Formula 4 may be a compound represented by any one of the compounds represented in Group 4 (any one of Chemical Formulas 4-1 to 4-9).

Group 4

(4-1)

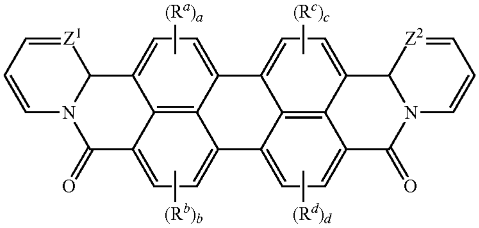

(4-2)

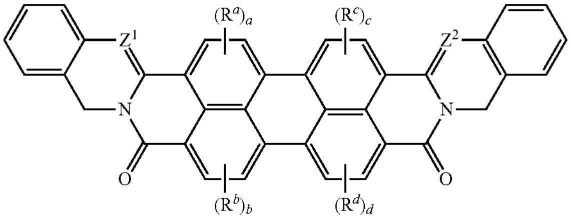

(4-3)

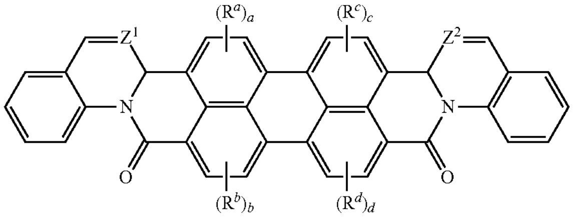

(4-4)

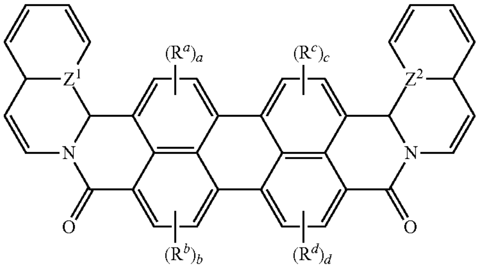

(4-5)

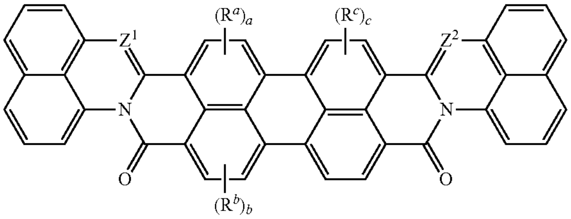

(4-6)

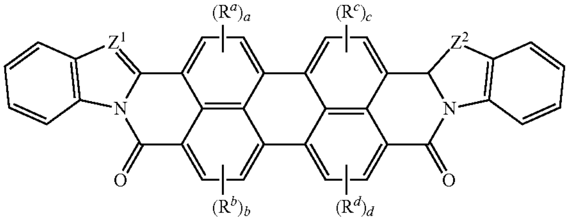

-continued (4-7)

(4-8)

(4-9)

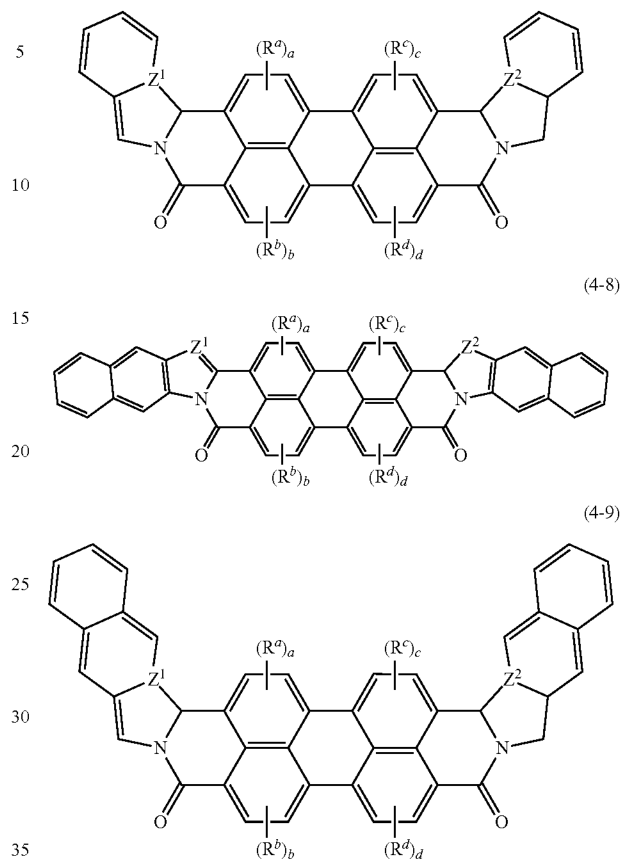

In Group 4 (Chemical Formulas 4-1 to 4-9), $R^a$, $R^b$, $R^c$, $R^d$, a, b, c, and d are the same as $R^a$, $R^b$, $R^c$, $R^d$, a, b, c, and d, respectively, in Chemical Formula 4, $Z^1$ and $Z^2$ are each independently $CR^x$ or N, wherein $R^x$ is hydrogen, deuterium, A C1 to C10 alkyl group, a C6 to C14 aryl group, a C3 to C12 heteroaryl group, or any combination thereof, at least one hydrogen of each aromatic ring or heteroaromatic ring may be present or may be replaced by deuterium, a C1 to C10 alkyl group, a C1 to C10 alkoxy group, a C6 to C10 aryl group, a C6 to C10 aryloxy group, or any combination thereof, and at least one —$CH_2$— of each aromatic ring or heteroaromatic ring may be present or may be replaced by —N—.

In Chemical Formula 5, $R^a$ to $R^c$ may each independently be a halogen, for example, a fluorine, chlorine, bromine, or iodine. For example, $R^a$ to $R^c$ may each independently be a fluorine, or a chlorine, or, for example, $R^a$ to $R^c$ may each independently be a chlorine, and a to c may each independently be 2 or 3, or for example, may each independently be 2.

In some example embodiments, the compound represented by Chemical Formula 5 may include a compound represented by Chemical Formula 5-1, a compound represented by Chemical Formula 5-2, or any combination thereof.

Chemical Formula 5-1

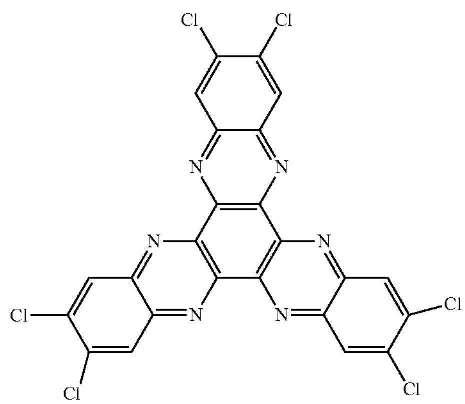

Chemical Formula 5-2

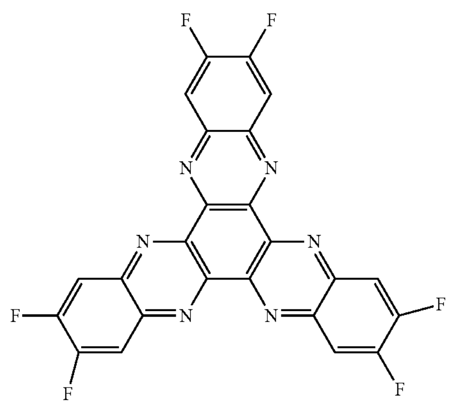

Fullerenes may be represented by the Chemical formula B:

Chemical Formula B

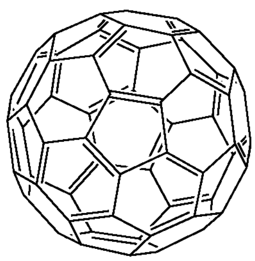

In some example embodiments, the first auxiliary layer 140 and the second auxiliary layer 150 may each independently include a compound represented by Chemical Formula 1, a compound represented by Chemical Formula 3, a compound represented by Chemical Formula 5, fullerene, or any combination thereof, for example, a compound represented by Chemical Formula 1, a compound represented by Chemical Formula 5, or any combination thereof, or for example, at least one of a compound represented by Chemical Formula 1 or a compound represented by Chemical Formula 5. In some example embodiments, the first auxiliary layer 140 and the second auxiliary layer 150 each independently comprises one or more of a compound represented by Chemical Formula 1 or a compound represented by Chemical Formula 5.

In some example embodiments, the compound represented by Chemical Formula 1 may include a compound represented by Chemical Formula 1-1, and the compound represented by Chemical Formula 5 may include the above compound represented by Chemical Formula 5-1:

Chemical Formula 1-1

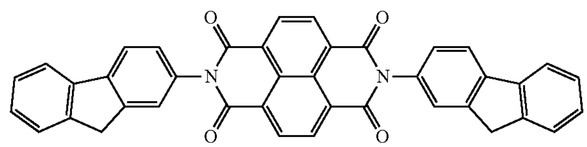

The compounds represented by Chemical Formulas 1 to 5 and fullerenes may be materials that can be vacuum deposited, i.e., sublimable materials that can be vacuum deposited by sublimation without decomposition or polymerization in a particular (or, alternatively, predetermined) temperature range. Sublimable materials may be identified by thermogravimetric analysis (TGA) and are the organic materials that lose weight as the temperature increases by at least about 50% of the initial weight, without substantial decomposition or polymerization.

In some example embodiments, the first auxiliary layer 140 and the second auxiliary layer 150 may each independently include, in addition to one or more compounds represented by one or more of Chemical Formulas 1 to 5, fullerenes, or any combination thereof, various materials that facilitate electron injection and/or transportation, and/or hole blocking, such as, for example, metal halides, such as, for example, LiF, NaCl, CsF, RbCl, RbI, or any combination thereof; Lanthanide metals, such as, for example, Yb; metals, such as, for example, calcium (Ca), potassium (K), aluminum (Al), or alloys thereof; metal oxides, such as, for example, $Li_2O$, BaO, and the like; Liq(Lithium quinolate), $Alq_3$(Tris(8-hydroxyquinolinato)aluminum), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, TPBi(1,3,5-Tri(1-phenyl-1H-benzo[d]imidazol-2-yl)phenyl), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tertbutylphenyl-1,2,4-triazole), NTAZ(4-(Naphthalen-1-yl)-3,5-diphenyl-4H-1,2,4-triazole), tBu-PBD(2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato)aluminum), $Bebq_2$(berylliumbis (benzoquinolin-10-olate), ADN(9,10-di(naphthalene-2-yl) anthracene), BmPyPhB(1,3-Bis[3,5-di(pyridin-3-yl)phenyl] benzene), or any combination thereof, and not limited thereto.

The infrared photodiode 100 may further include an anti-reflection layer (not shown) located below the anode 110 or above the cathode 120. For example, when the cathode 120 is a light receiving electrode, the anti-reflection layer may be located above the cathode 120. The anti-reflection layer is disposed on the side where light is incident to further improve light absorption by lowering the reflectivity of incident light. The anti-reflection layer may include, for example, a material having a refractive index of about 1.6 to 2.5, and may include, for example, at least one of metal oxide, metal sulfide, or organic material having a refractive index in the above range. The antireflection layer may be, for example, a metal oxide, such as, for example, aluminum-containing oxide, molybdenum-containing oxide, tungsten-containing oxide, vanadium-containing oxide, rhenium-containing oxide, niobium-containing oxide, tantalum-containing oxide, titanium-containing oxide, nickel-containing oxide, copper-containing oxide, cobalt-containing oxide, manganese-containing oxides, chromium-containing oxides, tellurium-containing oxides, or any combination thereof; a metal sulfide, such as, for example, zinc sulfide; or an organic material, such as, for example, an amine derivative, but is not limited thereto.

The infrared photodiode 100 may further include a focusing lens (not shown). The focusing lens may collect the light to a single point by controlling the direction of the incident light at a light incident position. The focusing lens may have a shape of, for example, a cylinder or a hemisphere, but is not limited thereto.

In the infrared photodiode 100, when light (e.g., incident light) enters from the cathode 120 and the photoelectric conversion layer 130 absorbs the light in a particular (or, alternatively, predetermined) wavelength region, excitons may be generated thereinside (e.g., in the photoelectric conversion layer 130). The excitons may be separated into holes and electrons in the photoelectric conversion layer 130, and the separated holes may be transported to an anode 110 and the separated electrons may be transported to the cathode 120 so as to flow a current (e.g., to induce a flow of an electrical current).

The infrared photodiode 100 may be applied to various fields using light in an infrared wavelength region as an electrical signal, and may be applied to, for example, a sensor. The sensor including the infrared photodiode 100 may be, for example, an image sensor for improving sensitivity in a low-light environment, a sensor for increasing detection capability of 3D images by broadening the dynamic range for detailed black and white contrast, a security sensor, a vehicle sensor, a biometric sensor, or the like. The biometric sensor may be, for example, an iris sensor, a distance sensor, a fingerprint sensor, or a blood vessel distribution sensor, but is not limited thereto. The sensor including the infrared photodiode 100 may be, for example, a CMOS infrared sensor or a CMOS image sensor.

While some example embodiments include the first and second auxiliary layers 140 and 150 in a photodiode including a photoelectric conversion layer 130 that includes an infrared absorbing material and is configured to absorb and photoelectrically convert infrared light, example embodiments are not limited thereto. For example, in some example embodiments, a photoelectric conversion device may be provided that includes an anode (corresponding to the anode 110 described with reference to FIG. 1) a cathode (corresponding to the cathode 120 described with reference to FIG. 1), a photoelectric conversion layer (corresponding to the photoelectric conversion layer 130 described with reference to FIG. 1) between the anode and the cathode, a first auxiliary layer (corresponding to the first auxiliary layer 140 according to any of the example embodiments) between the anode and the photoelectric conversion layer; and a second auxiliary layer (corresponding to the second auxiliary layer 150 according to any of the example embodiments) between the cathode and the photoelectric conversion layer, where the photoelectric conversion layer 130 is configured to absorb and/or photoelectrically convert incident light in one or more various wavelength regions, including for example a visible wavelength region, an infrared wavelength region, an ultraviolet wavelength region, or any combination thereof. The photoelectric conversion layer 130 may include a photoelectric conversion material having a peak absorption wavelength in the visible wavelength region, the infrared wavelength region, or the ultraviolet wavelength region.

Figure 2:
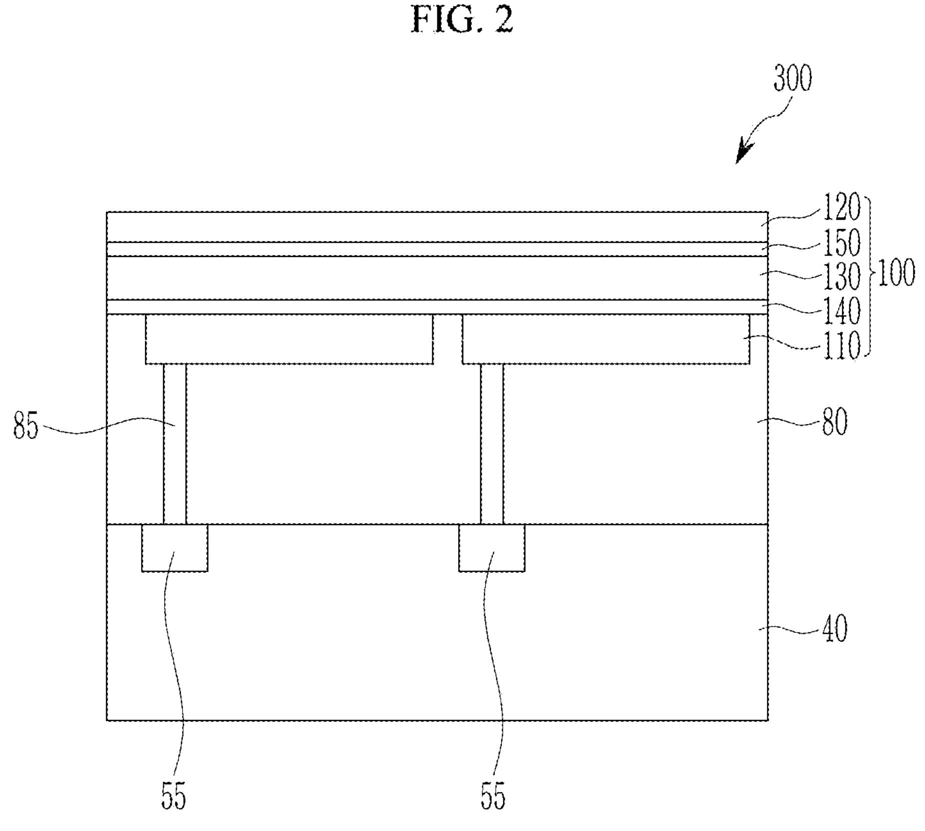
FIG. 2 is a cross-sectional view showing an example of a sensor according to some example embodiments.

FIG. 2 is a cross-sectional view showing an example of a sensor according to some example embodiments.

The sensor 300 according to some example embodiments includes a semiconductor substrate 40, an insulation layer 80, and an infrared photodiode 100.

The semiconductor substrate 40 may be a silicon substrate and is integrated with a transmission transistor (not shown) and a charge storage 55. The charge storage 55 may be integrated in each pixel. The charge storage 55 is electrically connected to the infrared photodiode 100 and information of the charge storage 55 may be transmitted by the transmission transistor.

A metal wire (not shown) and a pad (not shown) are formed on the semiconductor substrate 40. In order to decrease signal delay, the metal wire and pad may be made of a metal having low resistivity, for example, aluminum (Al), copper (Cu), silver (Ag), and alloys thereof, but is not limited thereto. However, it is not limited to the structure and the metal wire and pads may be disposed under the semiconductor substrate 40.

The insulation layer 80 is formed on the semiconductor substrate 40, for example on the metal wire and the pad. The insulation layer 80 may be made of an inorganic insulating material such as a silicon oxide and/or a silicon nitride, or a low dielectric constant (low K) material such as SiC, SiCOH, SiCO, and/or SiOF. The insulation layer 80 has a trench 85 exposing the charge storage 55. The trench 85 may be filled with fillers.

The aforementioned infrared photodiode 100 is formed on the insulation layer 80. As described above, the infrared photodiode 100 may include anode 110, cathode 120, a photoelectric conversion layer 130, a first auxiliary layer 140, and a second auxiliary layer 150, and optionally, may further include an anti-reflection layer (not shown) and/or an encapsulating layer (not shown). The description of the infrared photodiode 100 is the same as described above. A plurality of infrared photodiodes 100 may be arranged along rows and/or columns on the semiconductor substrate 40, for example, in a matrix form.

The infrared photodiode 100 may further include a focusing lens (not shown). The focusing lens may collect the light to a single point by controlling the direction of the incident light at a light incident position. The focusing lens may have a shape of, for example, a cylinder or a hemisphere, but is not limited thereto.

Figure 3:
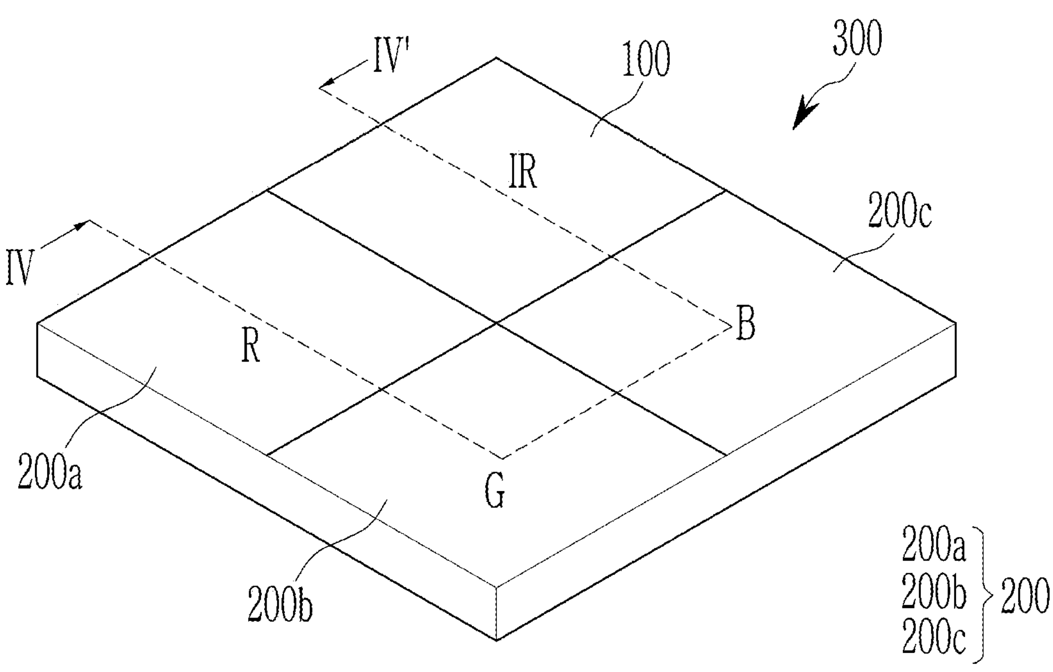
FIG. 3 is a perspective view schematically showing an example of a sensor according to some example embodiments.
Figure 4:
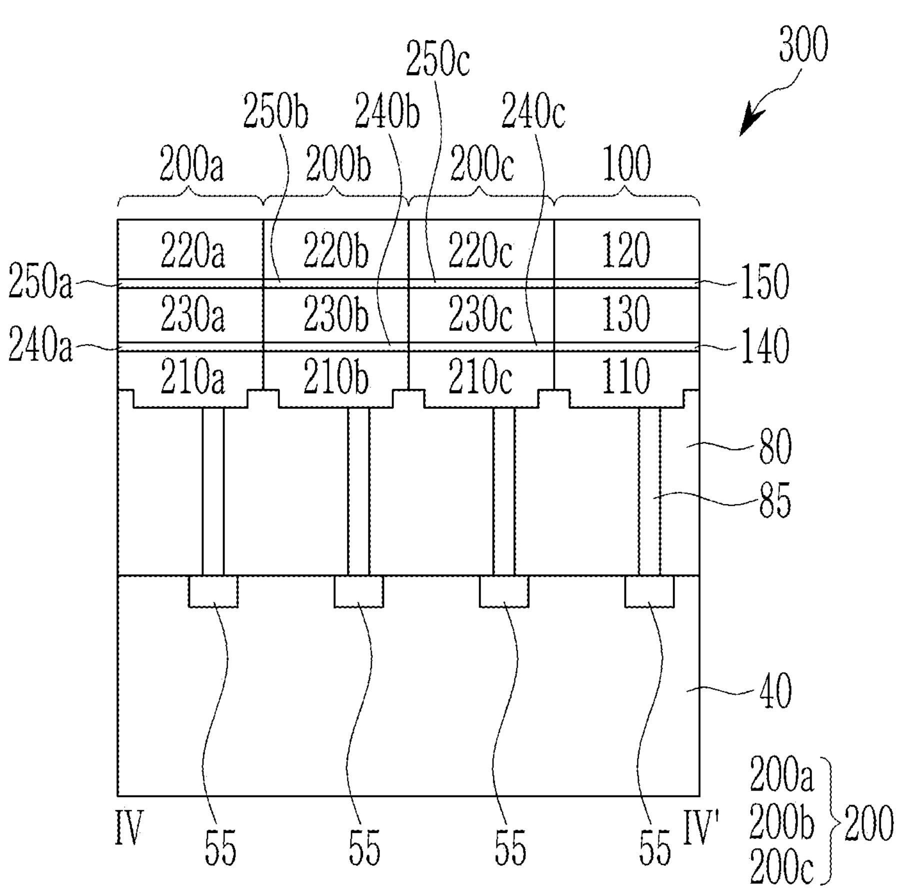
FIG. 4 is a cross-sectional view along cross-section view line IV-IV' of FIG. 3, schematically showing an example of the sensor of FIG. 3.

FIG. 3 is a perspective view schematically showing an example of a sensor according to some example embodiments, and FIG. 4 is a cross-sectional view along cross-section view line IV-IV' of FIG. 3, schematically showing an example of the sensor of FIG. 3.

Referring to FIGS. 3 and 4, the sensor 300 according to some example embodiments includes the semiconductor substrate 40, the infrared photodiode 100, and the visible photodiode 200. The visible photodiode 200 includes a red photodiode **200*a* detecting (e.g., configured to detect) light in a red wavelength region, a green photodiode 200*b* detecting light in a green wavelength region, and a blue photodiode 200*c* detecting light in a blue wavelength region. In some example embodiments, the visible photodiode 200** in any of the example embodiments may be the same as the visible photodiode in any of the example embodiments.

The infrared photodiode 100, the red photodiode **200*a*, the green photodiode 200*b*, and the blue photodiode 200*c* are aligned in a parallel direction to the surface of the semiconductor substrate 40 and respectively electrically connected to charge storage(s) 55 integrated in the semiconductor substrate 40. The infrared photodiode 100, the red photodiode 200***a*, the green photodiode 200*b*, and the blue photodiode 200*c* are each a photoelectric conversion device.

The infrared photodiode 100 is the same as described above.

The red photodiode 200*a* includes a lower electrode 210*a*, a red photoelectric conversion layer 230*a*, an upper electrode 220*a*, and buffer layers 240*a* and 250*a*. The green photodiode 200*b* includes a lower electrode 210*b*, a green photoelectric conversion layer 230*b*, an upper electrode 220*b*, and buffer layers 240*b* and 250*b*. The blue photodiode 200*c* includes a lower electrode 210*c*, a blue photoelectric conversion layer 230*c*, an upper electrode 220*c*, and buffer layers 240*c* and 250*c*. The red photoelectric conversion layer 230*a* may be configured to selectively absorb light in a red wavelength region for photoelectric conversion, the green photoelectric conversion layer 230*b* may be configured to selectively absorb light in a green wavelength region for photoelectric conversion, and the blue photoelectric conversion layer 230*c* may be configured to selectively absorb light in a blue wavelength region to perform photoelectric conversion. The lower electrodes 210*a*, 210*b*, and 210*c* and the upper electrodes 220*a*, 220*b*, and 220*c* may be light-transmitting electrodes, respectively. The red photoelectric conversion layer 230*a*, the green photoelectric conversion layer 230*b*, and the blue photoelectric conversion layer 230*c* may each independently include an inorganic light absorbing material, an organic light absorbing material, an organic-inorganic light absorbing material, or any combination thereof. For example, at least one of the red photoelectric conversion layer 230*a*, the green photoelectric conversion layer 230*b*, or the blue photoelectric conversion layer 230*c* may include an organic photoelectric conversion material. At least one of the buffer layers 240*a*, 240*b*, 240*c*, 250*a*, 250*b*, or 250*c* may be omitted.

The infrared photodiode 100 and/or sensor 300 may be applicable to various electronic devices, such as, for example, a mobile phone, a digital camera, a display device, biometric devices, security devices, and/or automotive electronics, etc., but example embodiments are not limited thereto.

Figure 5:
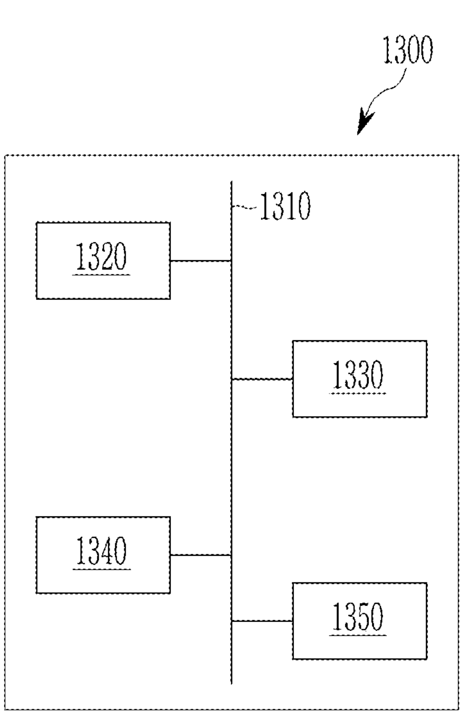
FIG. 5 is a schematic diagram of an electronic device according to some example embodiments.

FIG. 5 is a schematic diagram of an electronic device according to some example embodiments.

Referring to FIG. 5, the electronic device 1300 includes a processor 1320, a memory 1330, a sensor 1340, and a display unit 1350 (e.g., a light emitting diode (LED) display panel device, an organic LED (OLED) display panel device, or the like) which are electrically connected through a bus 1310. The sensor 1340 may be the aforementioned sensor 300 and/or the aforementioned infrared photodiode 100. The processor 1320 may perform a memory program and thus at least one function. The processor 1320 may additionally perform a memory program and thus display an image on the display unit 1350. The processor 1320 may generate an output.

The memory 1330 may be a non-transitory computer readable medium and may store a program of instructions. The memory 1330 may be a nonvolatile memory, such as a flash memory, a phase-change random access memory (PRAM), a magneto-resistive RAM (MRAM), a resistive RAM (ReRAM), or a ferro-electric RAM (FRAM), or a volatile memory, such as a static RAM (SRAM), a dynamic RAM (DRAM), or a synchronous DRAM (SDRAM). The processor 1320 may execute the stored program of instructions to perform one or more functions. For example, the processor 1320 may be configured to process electrical signals generated by the sensor 1340. The processor 1320 may include processing circuitry such as hardware including logic circuits; a hardware/software combination such as a processor executing software; or any combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processor 1320 may be configured to generate an output (e.g., an image to be displayed on the display unit 1350) based on such processing.

Hereinafter, some example embodiments are illustrated in more detail with reference to examples. However, the scope of the inventive concepts is not limited to these examples.

EXAMPLES

Examples 1 to 4

Silver (Ag) (80 nm), and ITO (8 nm) are sequentially deposited on a glass substrate to form a lower anode. Subsequently, the compound represented by Chemical Formula 1-1 (HOMO: 6.5 eV, LUMO: 3.5 eV) is deposited on the anode to form a first auxiliary layer having a thickness of 5 nm (Example 2) or 20 nm (Examples 1, 3, and 4), as described in Table 1. On the first auxiliary layer, Sn-naphthalocyanine dichloride represented by Chemical Formula A (a first material, a p-type semiconductor, $\lambda_{max,A}$: 870 nm, HOMO: 5.16 eV, LUMO: 3.96 eV) and fullerene represented by Chemical Formula B (C60) (a second material, an n-type semiconductor, $\lambda_{max,A}$: 450 nm, HOMO: 6.0 eV, LUMO: 4.3 eV) in a volume ratio (thickness ratio) of 35:170 are co-deposited to form a 205 nm-thick photoelectric conversion layer. On the photoelectric conversion layer, the compound represented by Chemical Formula 1-1 is deposited to form a second auxiliary layer having a thickness of 5 nm (Example 1), 20 nm (Examples 2 and 3), or 30 nm (Example 4), as described in Table 1. Subsequently, ytterbium (Yb) (5 nm) and silver (Ag) (30 nm) are sequentially deposited on the second auxiliary layer to form an upper cathode to manufacture infrared photodiodes according to Examples 1 to 4.

Chemical Formula 1-1

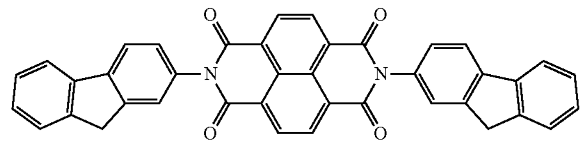

Chemical Formula A

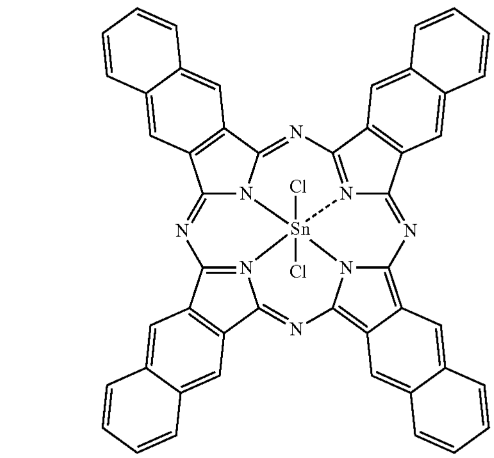

-continued

Chemical Formula B

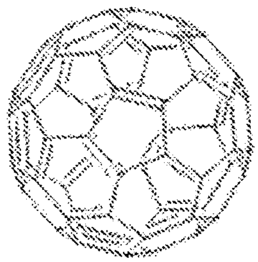

Comparative Examples 1 and 2

The same methods are used to manufacture the infrared photodiodes according to Comparative Examples 1 and 2 as Examples 1 to 4, except that the compound represented by Chemical Formula C is deposited to form a first auxiliary layer having a thickness of 20 nm (Comparative Example 1) and 30 nm (Comparative Example 2) on the anode, respectively, and the compound represented by Chemical Formula 1-1 is deposited to form a second auxiliary layer having a thickness of 5 nm (Comparative Example 1) and 20 nm (Comparative Example 2) on the photoelectric conversion layer, respectively, as described in Table 1 below.

Chemical Formula C

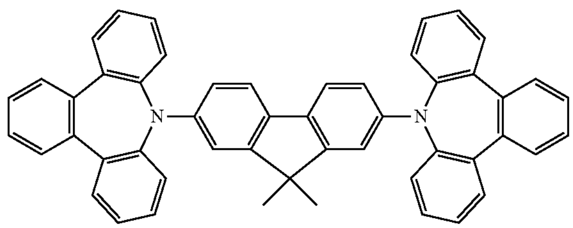

Evaluation I

EQE spectra of the infrared photodiodes manufactured in Examples 1 to 4 and Comparative Examples 1 and 2.

EQE spectra are measured by using a device (Incident Photon to Current Conversion Efficiency, IPCE) that measures efficiency of current conversion of photons injected at each wavelength regions described in Table 1 below, and the results are described in FIG. 6 and FIG. 7.

TABLE 1

| | Material of the first auxiliary layer (thickness (nm)) | Material of the second auxiliary layer (thickness (nm)) | Wave-length (nm) |
|---|---|---|---|
| Comparative Example 1 | Chemical Formula C (20 nm) | Chemical Formula 1-1 (5 nm) | 1195 |
| Example 1 | Chemical Formula 1-1 (20 nm) | Chemical Formula 1-1 (5 nm) | 1195 |
| Example 2 | Chemical Formula 1-1 (5 nm) | Chemical Formula 1-1 (20 nm) | 1195 |
| Example 3 | Chemical Formula 1-1 (20 nm) | Chemical Formula 1-1 (20 nm) | 1245 |
| Example 4 | Chemical Formula 1-1 (20 nm) | Chemical Formula 1-1 (30 nm) | 1295 |
| Comparative Example 2 | Chemical Formula C (30 nm) | Chemical Formula 1-1 (20 nm) | 1295 |

Figure 6:
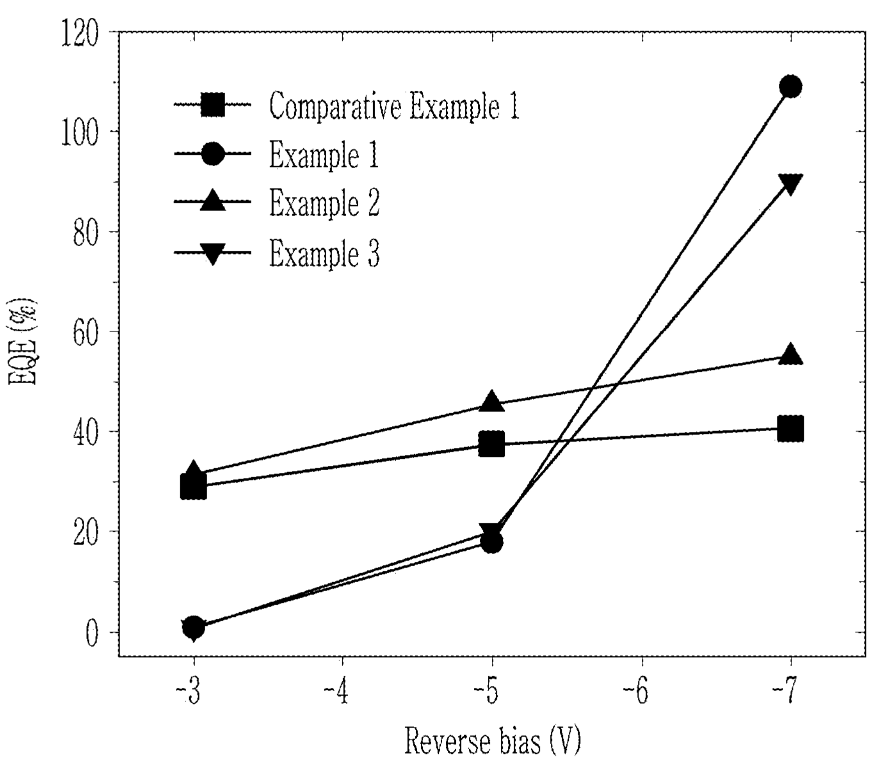
FIG. 6 shows external quantum efficiencies (EQE) versus reverse bias of the infrared photodiodes according to Examples 1 to 3 and Comparative Example 1.
Figure 7:
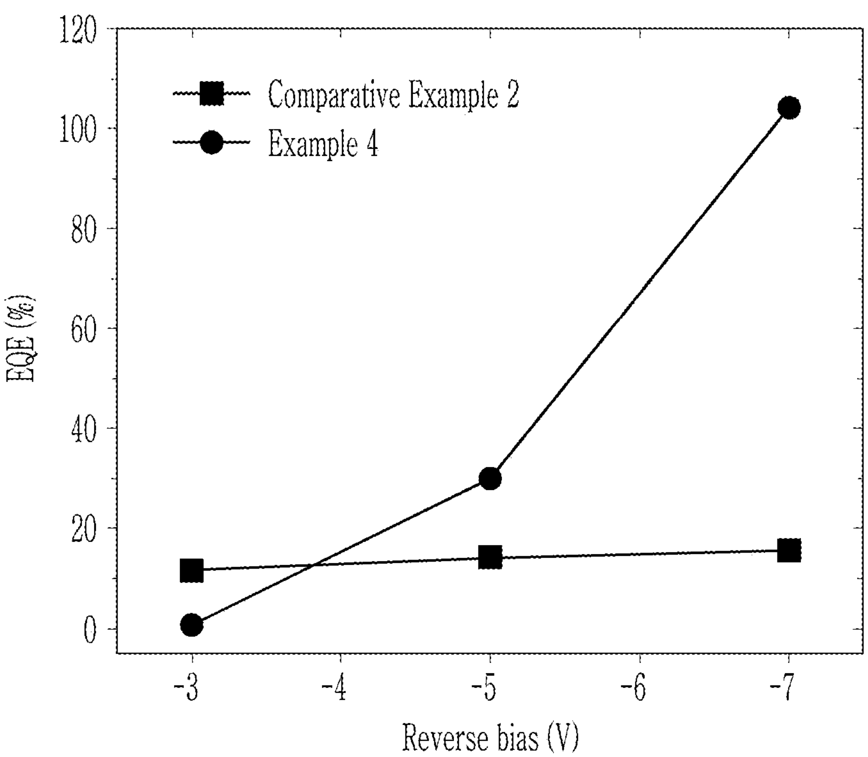
FIG. 7 shows external quantum efficiencies (EQE) versus reverse bias of the infrared photodiodes according to Example 4 and Comparative Example 2.

FIG. 6 shows EQE values of the infrared photodiodes according to Examples 1 to 3 and Comparative Example 1 as driving voltage changes, and FIG. 7 shows EQE values of the infrared photodiodes according to Example 4 and Comparative Example 2 as driving voltage (e.g., reverse bias voltage) changes.

Referring to FIG. 6, it can be seen that the infrared photodiodes according to Examples 1 and 3 exhibit light amplification under a reverse bias voltage (e.g., driving voltage) of about −5V. Specifically, when the driving voltage is increased to about −7V, EQE greatly increases to about 90% to 100% for the infrared photodiodes according to Examples 1 and 3.

On the contrary, the infrared photodiodes according to Comparative Example 1 did not exhibit light amplification even when the driving voltage was increased to −7V. Comparative Example 1 shows the EQE spectrum of an infrared photodiode configured similarly to a conventional infrared photodiode by including the compound represented by the Chemical Formula C, which is usually used as a hole transport material, not an electron transport material, in the first auxiliary layer. On the other hand, although the infrared photodiode according to Example 2 includes the same electron transport material as Example 1 or Example 3 in the first auxiliary layer, the thickness of the first auxiliary layer is as thin as 5 nm. Accordingly, it is assumed that the holes separated from the photoelectric conversion layer do not stay in the first auxiliary layer, and thus, light amplification does not occur.

Referring to FIG. 7, in Example 4, similarly to Examples 1 and 3, light amplification occurs at a reverse bias voltage of about −5V. On the other hand, similar to a conventional infrared photodiode, the infrared photodiode according to Comparative Example 2, which includes a hole transport material (e.g., the compound represented by the Chemical Formula C) in the first auxiliary layer, does not exhibit light amplification even when the driving voltage is increased to −7V.

From the results above, it is confirmed that the infrared photodiode according to some example embodiments that includes an electron transport material in both the first auxiliary layer and the second auxiliary layer is configured to exhibit light amplification phenomenon at at least a specific driving voltage (e.g., a specific driving voltage magnitude), unlike the infrared photodiode of the comparative example(s) that includes a hole transport material in the first auxiliary layer.

Examples 5 to 9

Silver (Ag) (80 nm), and ITO (8 nm) are sequentially deposited on a glass substrate to form a lower anode. Subsequently, the compound represented by Chemical Formula 5-1, which has electron transporting properties, is deposited on the anode to form a first auxiliary layer having a thickness of 10 nm (Examples 5 to 9). On the first auxiliary layer, Sn-naphthalocyanine dichloride represented by Chemical Formula A (a first material, a p-type semiconductor, $\lambda_{max,A}$: 870 nm, HOMO: 5.16 eV, LUMO: 3.96 eV) and fullerene represented by Chemical Formula B (C60) (a second material, an n-type semiconductor, $\lambda_{max,A}$: 450 nm, HOMO: 6.0 eV, LUMO: 4.3 eV) in a volume ratio (thickness ratio) of 35:170 are co-deposited to form a 205 nm-thick photoelectric conversion layer. On the photoelectric conversion layer, each of the compound represented by Chemical Formula 1-1 (Examples 5 and 6), the compound represented by Chemical Formula 5-1 (Example 7), fullerene represented by Chemical Formula B (Example 8), or the compound represented by Chemical Formula 3-1A (Example 9), is deposited to form a second auxiliary layer having a thickness of 20 nm (Example 5) or 25 nm (Examples 6 to 9), respectively, as described in Table 2. Subsequently, ytterbium (Yb) (5 nm) and silver (Ag) (30 nm) are sequentially deposited thereon to form an upper cathode to manufacture infrared photodiodes according to Examples 5 to 9.

Chemical Formula 5-1

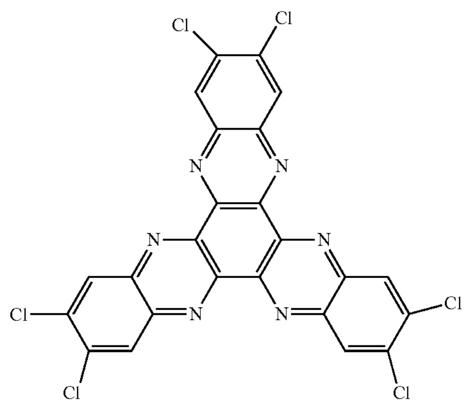

Chemical Formula 3-1A

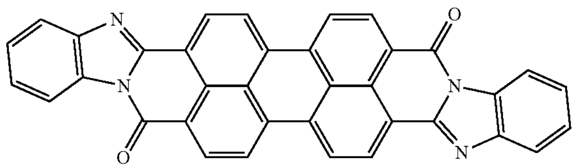

-continued

Chemical Formula B

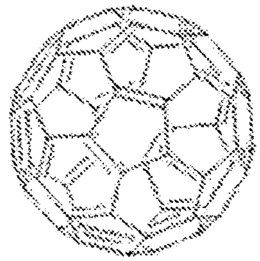

Comparative Example 3

The same method is used to manufacture the infrared photodiodes according to Comparative Example 3 as Examples 5 to 9, except that the compound represented by Chemical Formula C is deposited on the anode to form the first auxiliary layer having a thickness of 30 nm, and the compound represented by Chemical Formula 1-1 is deposited to form the second auxiliary layer having a thickness of 7 nm on the photoelectric conversion layer, respectively.

Evaluation II

EQE values of each infrared photodiode according to Examples 5 to 9 and Comparative Example 3 are measured using IPCE under the condition that the center wavelength of the infrared photodiode is extended to 1300 nm. In addition, the EQE value and dark current density at the driving voltage (reverse bias voltage) of about −3V are measured, and the results are shown in Table 2 and FIGS. 8 and 9 below.

The dark current is evaluated by measuring the dark current by using a current-voltage evaluation equipment (Keithley K4200 parameter analyzer) and dividing it by the unit pixel area (0.04 $cm^2$) to calculate the dark current density, which is evaluated from the current when −3V reverse bias is applied.

TABLE 2

| | Material of the first auxiliary layer (thickness (nm)) | Material of the second auxiliary layer (thickness (nm)) | EQE @−3 V | Dark current density @−3 V ($h/s/\mu m^2$) |
|---|---|---|---|---|
| Example 5 | Chemical Formula 5-1 (10 nm) | Chemical Formula 1-1 (20 nm) | 34% (λ 1290 nm) | $2.26 \times 10^5$ |
| Example 6 | Chemical Formula 5-1 (10 nm) | Chemical Formula 1-1 (25 nm) | 27% (λ 1325 nm) | $4.44 \times 10^5$ |
| Example 7 | Chemical Formula 5-1 (10 nm) | Chemical Formula 5-1 (25 nm) | 11% (λ 1335 nm) | $3.91 \times 10^5$ |
| Example 8 | Chemical Formula 5-1 (10 nm) | Chemical Formula B (25 nm) | 15% (λ 1335 nm) | $3.81 \times 10^5$ |
| Example 9 | Chemical Formula 5-1 (10 nm) | Chemical Formula 3-1A (25 nm) | 13% (λ 1350 nm) | $5.28 \times 10^5$ |
| Comparative Example 3 | Chemical Formula C (30 nm) | Chemical Formula 1-1 (7 nm) | 8% (λ 1325 nm) | $1.47 \times 10^5$ |

Figure 8:
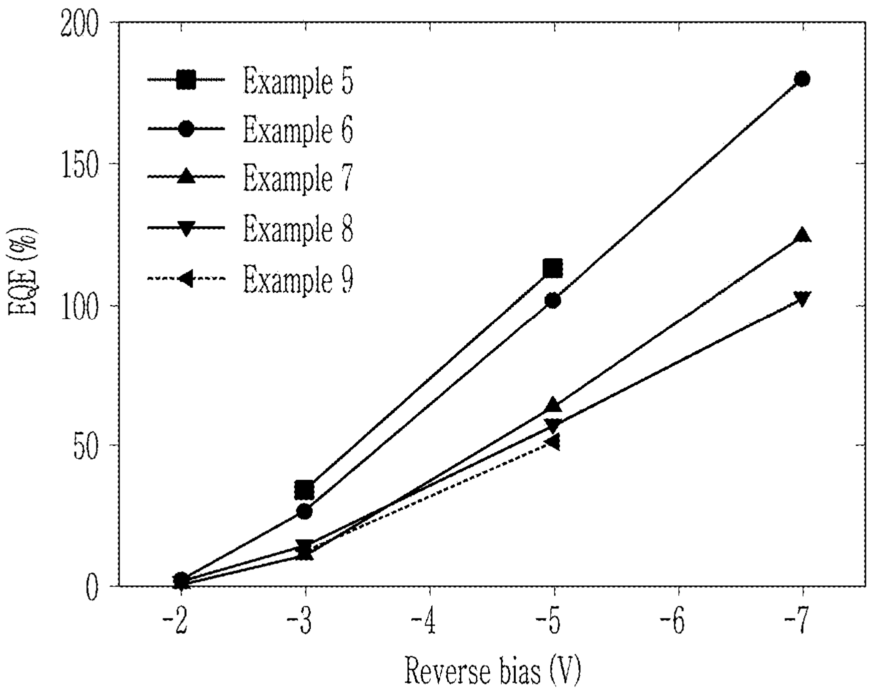
FIG. 8 shows external quantum efficiencies (EQE) versus reverse bias of the infrared photodiodes according to Examples 5 to 9.
Figure 9:
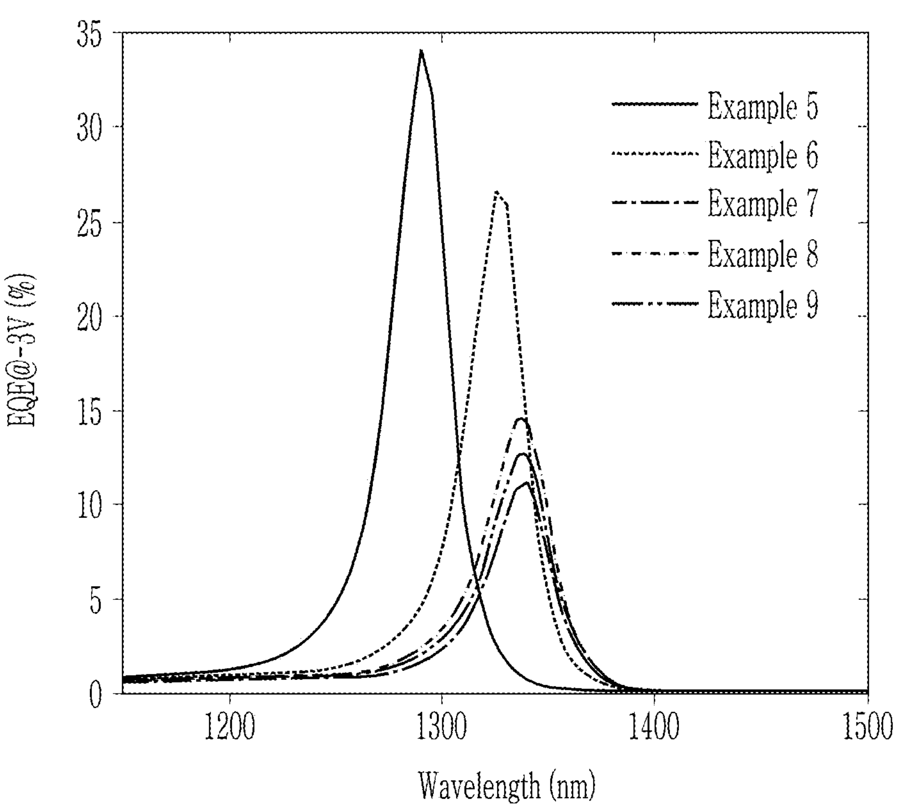
FIG. 9 shows external quantum efficiency (EQE) spectra of the infrared photodiodes according to Examples 5 to 9 upon changing wavelengths at −3 volts (V).

FIG. 8 shows external quantum efficiencies (EQE) versus applied voltage (reverse bias voltage, driving voltage, etc.) of the infrared photodiodes according to Examples 5 to 9, and FIG. 9 shows external quantum efficiency (EQE) spectra of the infrared photodiodes according to Examples 5 to 9 upon changing wavelengths at −3 volts (V).

Referring to Table 2 and FIGS. 8 and 9, the infrared photodiode according to Examples 5 to 9 include a first auxiliary layer material represented by Chemical Formula 5-1, which is different from that of Examples 1 to 4, and the thickness of the first auxiliary layer is 10 nm, which is half that of Examples 1, 3, and 4. As a result, the infrared photodiodes according to Examples 5 to 9 exhibit very high EQE values of about 27% to about 34% under a driving voltage lower than that of the infrared photodiode according to Example 1, Example 3, and Example 4, that is, under a driving voltage of about −3V and a long wavelength of about 1300 nm. In addition, the dark current densities of the infrared photodiodes according to Examples 5 to 8 at about −3V are also maintained at relatively low levels.

The infrared photodiode according to Comparative Example 3 includes the compound represented by Chemical Formula C, which is a hole transport material, as the first auxiliary layer material, and includes the same material as that in the infrared photodiodes according to Examples 5 and 6 (Chemical Formula 1-1) as the second auxiliary layer material. The EQE of the infrared photodiode according to Comparative Example 3 measured at a long wavelength of about 1300 nm under a driving voltage of about −3V is only about 8%.

From the above results, according to some example embodiments, an infrared photodiode containing an electron transport material both between the lower anode and the photoelectric conversion layer and between the upper cathode and the photoelectric conversion layer may exhibit better photoelectric conversion efficiency at a lower driving voltage due to light amplification.

While the inventive concepts have been described in connection with what is presently considered to be practical example embodiments, it is to be understood that the inventive concepts are not limited to such example embodiments. On the contrary, the inventive concepts are intended to cover various modifications and equivalent arrangements included within the spirit and scope of the appended claims.

What is claimed is:

1. An infrared photodiode, comprising:

an anode;

a cathode;

a photoelectric conversion layer between the anode and the cathode, the photoelectric conversion layer including an infrared absorbing material;

a first auxiliary layer between the anode and the photoelectric conversion layer; and a second auxiliary layer between the cathode and the photoelectric conversion layer, wherein the first auxiliary layer and the second auxiliary layer each independently includes an electron transport material that is configured to facilitate electron introduction, and/or facilitate electron transport, and/or inhibit hole movement.

2. The infrared photodiode of claim 1, wherein a thickness of the first auxiliary layer is greater than about 3 nm and less than about 50 nm.

3. The infrared photodiode of claim 1, wherein a thickness of the second auxiliary layer is greater than or equal to about 1 nm and less than or equal to about 50 nm.

4. The infrared photodiode of claim 1, wherein the electron transport material included in the first auxiliary layer has a same bandgap energy or a smaller bandgap energy in relation to the electron transport material included in the second auxiliary layer.

5. The infrared photodiode of claim 1, wherein a bandgap energy of the electron transport material included in the first auxiliary layer is in a range of from about 2.5 eV to about 3.5 eV, and a bandgap energy of the electron transport material included in the second auxiliary layer is in a range of from about 3.0 eV to about 3.5 eV.

6. The infrared photodiode of claim 1, wherein a highest occupied molecular orbital (HOMO) energy of the electron transport material included in the first auxiliary layer is in a range of from about 5.5 eV to about 7.5 eV.

7. The infrared photodiode of claim 1, wherein a lowest unoccupied molecular orbital (LUMO) energy of the electron transport material included in the second auxiliary layer is in a range of from about 2.5 eV to about 4.5 eV.

8. The infrared photodiode of claim 1, wherein the electron transport material comprises one or more of compounds represented by Chemical Formulae 1 to 5 and fullerene:

Chemical Formula 1

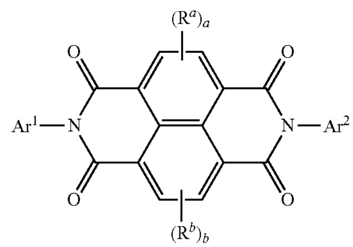

wherein in Chemical Formula 1, $Ar^1$ and $Ar^2$ are each independently a substituted or unsubstituted C10 to C30 aryl group or a substituted or unsubstituted C2 to C30 heteroaryl group, $R^a$ and $R^b$ are each independently hydrogen, deuterium, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C20 aryl group, a substituted or unsubstituted C6 to C20 aryloxy group, a substituted or unsubstituted C3 to C20 heteroaryl group, a substituted or unsubstituted C3 to C20 cycloalkyl group, a substituted or unsubstituted C3 to C20 heterocycloalkyl group, or any combination thereof, and a and b are each independently integers of 1 or 2, Chemical Formula 2

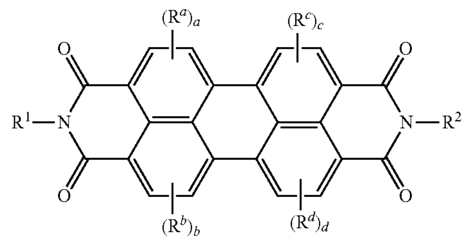

wherein, in Chemical Formula 2, $R^1$ and $R^2$ are each independently hydrogen, deuterium, a substituted or unsubstituted C6 to C30 aryl group, or a substituted or unsubstituted C3 to C30 heteroaryl group, $R^a$ to $R^d$ are each independently hydrogen, deuterium, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C20 aryl group, a substituted or unsubstituted C6 to C20 aryloxy group, a substituted or unsubstituted C3 to C20 heteroaryl group, a substituted or unsubstituted C3 to C20 cycloalkyl group, a substituted or unsubstituted C3 to C20 heterocycloalkyl group, or any combination thereof, and a to d are each independently an integer of 1 or 2, Chemical Formula 3

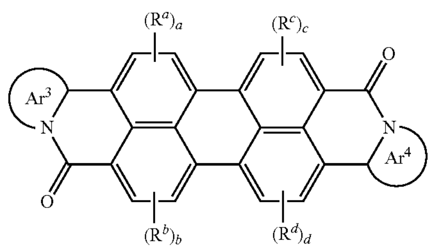

Chemical Formula 4

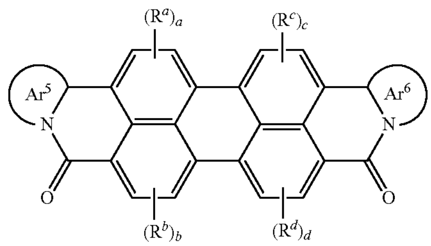

wherein, in Chemical Formulas 3 and 4, $Ar^3$ to $Ar^6$ are each independently hydrogen, a substituted or unsubstituted C6 to C30 arene group, or a substituted or unsubstituted C3 to C30 heteroarene group, $R^a$ to $R^d$ are each independently be hydrogen, deuterium, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C20 aryl group, a substituted or unsubstituted C6 to C20 aryloxy group, a substituted or unsubstituted C3 to C20 heteroaryl group, a substituted or unsubstituted C3 to C20 cycloalkyl group, a substituted or unsubstituted C3 to C20 heterocycloalkyl group, or any combination thereof, and a to d are each independently an integer of 1 or 2, Chemical Formula 5

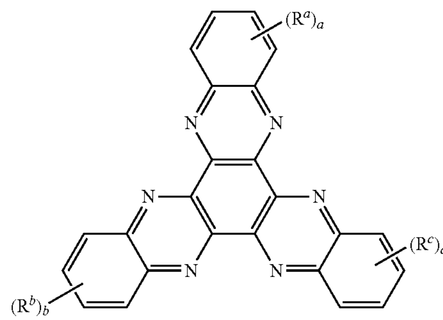

wherein, in Chemical Formula 5, $R^a$ to $R^c$ are each independently be hydrogen, deuterium, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C30 alkoxy group, a substituted or unsubstituted C6 to C20 aryl group, a substituted or unsubstituted C6 to C20 aryloxy group, a substituted or unsubstituted C3 to C20 heteroaryl group, a substituted or unsubstituted C3 to C20 cycloalkyl group, a substituted or unsubstituted C3 to C20 heterocycloalkyl group, or any combination thereof, and a to c are each independently an integer of 1 to 4.

9. The infrared photodiode of claim 8, wherein the first auxiliary layer and the second auxiliary layer each independently comprises one or more of a compound represented by Chemical Formula 1 or a compound represented by Chemical Formula 5.

10. The infrared photodiode of claim 1, wherein the photoelectric conversion layer comprises the infrared absorbing material and a counter material forming a pn junction with the infrared absorbing material.

11. The infrared photodiode of claim 1, wherein a peak wavelength of an EQE spectrum of the infrared photodiode is in a range of from about 1000 nm to about 3000 nm, and a peak wavelength of an absorption spectrum of the photoelectric conversion layer is greater than about 700 nm and less than about 1500 nm.

12. The infrared photodiode of claim 1, wherein the infrared absorbing material comprises a metal phthalocyanine complex, a metal naphthalocyanine complex, a coplanar compound comprising at least one quinoid moiety, or any combination thereof.

13. The infrared photodiode of claim 12, wherein the coplanar compound comprising the at least one quinoid moiety is represented by Chemical Formula 6:

Chemical Formula 6

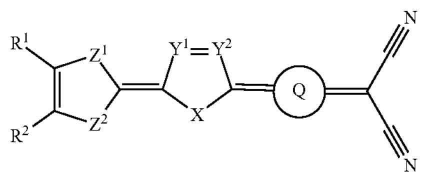

wherein, in Chemical Formula 6,

X is O, S, Se, Te, SO, $SO_2$, $NR^a$, $CR^bR^c$, or $SiR^dR^e$;

$Y^1$ and $Y^2$ are each independently $CR^f$ or N;

$Z^1$ and $Z^2$ are each independently O, S, Se, Te, or $NR^g$;

Q is at least one substituted or unsubstituted 5-membered quinoid ring, at least one substituted or unsubstituted 6-membered quinoid ring, or a fused ring thereof;

$R^1$ and $R^2$ are each independently hydrogen, a substituted or unsubstituted C1 to C30 alkyl group, a substituted or unsubstituted C1 to C30 alkoxy group, a substituted or unsubstituted C1 to C30 thioalkoxy group, a substituted or unsubstituted C6 to C30 aryl group, a substituted or unsubstituted C3 to C30 heterocyclic group, a substituted or unsubstituted silyl group, a halogen, or any combination thereof;

$R^a$ to $R^g$ are each independently hydrogen, a substituted or unsubstituted C1 to C30 alkyl group, a substituted or unsubstituted C1 to C30 alkoxy group, a substituted or unsubstituted C6 to C30 aryl group, a substituted or unsubstituted C3 to C30 heterocyclic group, a substituted or unsubstituted silyl group, a halogen, a cyano group, or any combination thereof;

$R^1$ and $R^2$ are each independently present or combine with each other to form a ring;

$R^b$ and $R^c$ are each independently present or combine with each other to form a ring;

$R^d$ and $R^e$ are each independently present or combine with each other to form a ring; and adjacent $R^f$'s are each independently present or combine with each other to form a ring.

14. The infrared photodiode of claim 1, wherein the anode comprises a reflective layer, and the cathode comprises a semi-transparent layer.

15. The infrared photodiode of claim 1, wherein the cathode comprises an inorganic nanolayer that faces the photoelectric conversion layer, wherein the inorganic nanolayer comprises ytterbium (Yb), calcium (Ca), potassium (K), barium (Ba), magnesium (Mg), lithium fluoride (LiF), or any alloy thereof.

16. The infrared photodiode of claim 14, wherein the anode further comprises a light-transmitting auxiliary layer between the reflective layer and the photoelectric conversion layer.

17. The infrared photodiode of claim 16, wherein a thickness of the light-transmitting auxiliary layer is in a range of from about 5 nm to about 50 nm.

18. The infrared photodiode of claim 1, wherein the infrared photodiode is configured to exhibit light amplification in response to a driving voltage applied to the infrared photodiode being equal to or greater than a specific driving voltage magnitude.

19. A sensor comprising:

a semiconductor substrate, and the infrared photodiode according to claim 1 on the semiconductor substrate.

20. An electronic device comprising the infrared photodiode of claim 1.

* * * * *